United States Patent
Nakao et al.

(10) Patent No.: US 8,247,474 B2
(45) Date of Patent: Aug. 21, 2012

(54) METHOD OF MANUFACTURING BASE LAYER, INK FOR INKJET AND ELECTRONIC COMPONENTS

(75) Inventors: Keiichi Nakao, Osaka (JP); Yukihiro Shimasaki, Hyogo (JP); Atsushi Iwase, Mie (JP); Koji Shimoyama, Mie (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/098,914

(22) Filed: May 2, 2011

(65) Prior Publication Data

US 2011/0203482 A1 Aug. 25, 2011

Related U.S. Application Data

(60) Division of application No. 12/339,826, filed on Dec. 19, 2008, which is a continuation-in-part of application No. 11/048,737, filed on Feb. 3, 2005, now abandoned, which is a division of application No. 10/311,222, filed as application No. PCT/JP02/03966 on Apr. 19, 2002, now Pat. No. 6,855,367.

(30) Foreign Application Priority Data

Apr. 20, 2001 (JP) ................... 2001-122442
Nov. 28, 2008 (JP) ................... 2008-303972

(51) Int. Cl.
*C09D 11/00* (2006.01)
(52) U.S. Cl. .............. 523/160; 523/161; 106/31.13; 427/58; 427/80; 427/126.2; 427/123; 347/1
(58) Field of Classification Search .......... 523/160
See application file for complete search history.

(56) References Cited

U.S. PATENT DOCUMENTS

| 5,064,711 | A | 11/1991 | Ito et al. |
| 5,380,769 | A | 1/1995 | Titterington et al. |
| 5,609,704 | A * | 3/1997 | Hayama et al. ............. 156/89.16 |
| 5,980,998 | A | 11/1999 | Sharma et al. |
| 6,207,329 | B1 | 3/2001 | Shirota et al. |
| 6,487,774 | B1 | 12/2002 | Nakao et al. |
| 6,754,551 | B1 | 6/2004 | Zohar et al. |

(Continued)

FOREIGN PATENT DOCUMENTS

DE 3805841 8/1989

(Continued)

OTHER PUBLICATIONS

"Forming Metallized Patterns on Ceramic Substrates"; *IBM Technical Disclosure Bulletin;* c. Feb. 1, 1973; vol. 15, No. 9; pp. 2841-2842.

(Continued)

*Primary Examiner* — Doris Lee
(74) *Attorney, Agent, or Firm* — McDermott Will & Emery LLP

(57) ABSTRACT

A base layer is formed on the surface of metal plate, metal pipe, unbaked ceramic sheet, laminated ceramic green sheet, etc., the base layer causing a gelling reaction with inkjet-ink. The base layer improves ink acceptability for low viscosity inks such as inkjet-ink, and prevents oozing, draining, uneven thickness of an ink pattern and a resist pattern. Thus, the present invention enables to use an ink jet process for providing resist patterns for etching, etc., which has to fulfill stringent high precision requirements.

3 Claims, 15 Drawing Sheets

U.S. PATENT DOCUMENTS

2003/0063155 A1   4/2003  Nakao et al.

FOREIGN PATENT DOCUMENTS

| | | |
|---|---|---|
| EP | 0 989 570 | 3/2000 |
| EP | 0 989 570 A1 | 3/2008 |
| JP | 58-0050795 | 3/1983 |
| JP | 60-142369 A | 7/1985 |
| JP | 61-184571 A | 8/1986 |
| JP | 64-005095 | 1/1989 |
| JP | 05-158349 | 6/1993 |
| JP | 06-218712 | 8/1994 |
| JP | 07-199643 | 8/1995 |
| JP | 08-160736 | 6/1996 |
| JP | 08-222475 | 8/1996 |
| JP | 8-253358 | 10/1996 |
| JP | 08-328376 | 12/1996 |
| JP | 09-171298 | 6/1997 |
| JP | 10-199331 A | 7/1998 |
| JP | 10-335167 | 12/1998 |
| JP | 11-102615 | 4/1999 |
| JP | 11-133728 | 5/1999 |
| JP | 11-217693 A | 8/1999 |
| JP | 2000-182889 | 6/2000 |
| JP | 2000-216047 | 8/2000 |
| JP | 2000-288879 | 10/2000 |
| JP | 2000-327964 | 11/2000 |
| JP | 2001-216839 | 8/2001 |
| JP | 2002-096441 A | 4/2002 |
| JP | 2002-264547 | 9/2002 |
| JP | 2003-155581 | 5/2003 |
| JP | 2004-061703 | 2/2004 |
| JP | 2006-317684 | 11/2006 |
| JP | 2006-343542 | 12/2006 |
| JP | 2007-093705 | 4/2007 |
| JP | 2007-108782 | 4/2007 |
| WO | WO 99/38176 | 7/1999 |

OTHER PUBLICATIONS

European Search Report; issued in International Patent Application No. 02718627.9-1235, dated on Mar. 14, 2008.

Japanese Office Action issued in Japanese Patent Application No. 2002-584348, mailed on Sep. 4, 2007.

Japanese Office Action issued in Japanese Patent Application No. 2008-303972, mailed on Jan. 18, 2007.

United States Office Action issued in U.S. Appl. No. 12/339,826 dated May 11, 2011.

US Office Action issued in U.S. Appl. No. 13/098,895 issued on Jun. 15, 2012.

* cited by examiner

METHOD OF MANUFACTURING BASE LAYER, INK FOR INKJET AND ELECTRONIC COMPONENTS

RELATED APPLICATIONS

This application is a Divisional of U.S. patent application Ser. No. 12/339,826, filed on Dec. 19, 2008, which is a Continuation-In-Part (CIP) of application Ser. No. 11/048,737, filed Feb. 3, 2005, now abandoned, which is a Divisional of application Ser. No. 10/311,222, filed Mar. 21, 2003, now U.S. Pat. No. 6,855,367, which is a U.S. National Phase of International Application No. PCT/JP2002/003966, filed Apr. 19, 2002, claiming priority of Japanese Application Nos. 2001-122442, filed Apr. 20, 2001 and 2008-303972, filed on Nov. 28, 2008, the entire contents of each of the foregoing applications are hereby incorporated by reference.

BACKGROUND OF THE INVENTION

1. Field of the Invention

The present invention relates to a method of manufacturing ceramic electronic components such as ceramic parts, laminated ceramic capacitors, LC filters, and composite high-frequency electronic components. The method uses a computer-controlled ink-jet apparatus, which jets ink to form the foregoing various electronic components on non-contact basis.

Further, the present invention enables a computer-controlled ink jet apparatus to form a high-precision pattern with least oozing and dropping of ink on the surface of low ink acceptability, such as metal surface. Also on the surface of a three-dimensional substance, a high-precision pattern can be formed. Furthermore, on the surface of a metal pipe, for example, which exhibits low ink acceptability and three-dimensional, a high-precision pattern can be formed with least oozing and dripping. An ink pattern provided in accordance with the present invention can also be used for an etching resist. So, it can be used for manufacturing printers' magnet rolls and the like various types of electronic components.

2. Background Art

A conventional method of manufacturing various ceramic electronic components, first of all, prints a predetermined electrode pattern on an unbaked ceramic member such as a green sheet of ceramic by, e.g., screen printing. Next, laminate the ceramic green sheets on which the electrode patterns are printed, then cut the laminated sheet in a given shape, and bake them. Finally form external electrodes. Another method forms conductive or insulating patterns on an unbaked ceramic member, then bake the member.

A conventional printing method such as a screen printing can form electrodes in an identical shape; however, it is not good at forming electrodes of different patterns, i.e., small batches of a variety of products, or forming electrodes on non-contact basis, or forming electrodes at a high speed. Japanese Patent Application Non-examined Publication No. 2000-327964 and No. 2000-182889 disclose methods of manufacturing electronic components using inkjet for overcoming the foregoing problems. However, forming an electrode pattern using inkjet depends on surface condition of a substrate on which the pattern is to be printed. Thus some ceramic green sheet repels water or oil of ink, which produces non-uniform thickness of the printed pattern. As a result, a desirable electrode pattern cannot be formed.

Problems of ink acceptability of those substrates to be printed are described with reference to FIG. 11. FIG. 11A and FIG. 11B show an electrode-shape required as a ceramic electronic component. Electrode pattern 1 shown in FIG. 11A has no pin-hole therein, and is required to have a uniform thickness and to be a highly accurate fine pattern. Therefore, in FIG. 11B, electrode pattern 1 is formed on a ceramic green sheet on base film 2 in a uniform thickness.

FIG. 11C illustrates an electrode pattern formed with conventional inkjet. As shown in FIG. 11C, the electrode patterns formed with inkjet on the ceramic green sheet are deformed due to repelling the jetted ink on the surface because the ceramic green sheet does not have ink acceptability. FIG. 11D is a sectional view of FIG. 11C and shows a cross section of the electrode patterns formed with the conventional inkjet. As shown in FIG. 11C and FIG. 11D, electrode patterns 4 are repelled and deformed, which is caused by poor wetness, namely, low ink-acceptability of the ceramic green sheet on which patterns are to be printed. This is a similar phenomenon as a water drop is repelled on a base substrate which has been processed to repel water and oil. If such an ink-repellant phenomenon occurs in an electrode pattern, pinhole 5 tends to be formed inside electrode pattern 4. As a result, repelled electrode pattern 4 ends up having non-uniform thickness.

As such, jetted ink landed on the surface of the substrate is deformed as shown in FIG. 11C and FIG. 11D because the viscosity of the ink is as low as 0.01-0.1 poise and extremely subjected to surface tension of the substrate on which patterns are to be printed. Thus the landed ink is deformed before the ink is dried or cured. In the case of screen printing, on the other hand, the viscosity of ink is as high as several hundreds poise, and the ink is hardly deformed. In a case of an inkjet printer using papers available in the consumer market, since landed ink soaks into the paper, such uneven printing does not occur. However, in the case of ceramic electronic component posed in the present invention, if jetted ink soaks into a ceramic green sheet, electrical insulation or reliability of a finished component is sometimes substantially degraded. Quick-drying of landed ink is one of measures against such a problem. However, quick-drying ink tends to dry and harden at a tip of a printer head of an inkjet apparatus, and eventually clogs the printer head. Therefore, it is not good at producing stable print for long hours.

As discussed above, efforts have been made for printing given electrode-patterns accurately using inkjet; however, as shown in FIG. 11C and FIG. 11D, irregular bumps and dips are formed in a sectional view of electrode patterns, thus a required electronic component cannot be produced.

An apparatus that forms a given three-dimensional structure using laser beam is recently commercialized. This apparatus exposes photo-sensitive resin to laser beam and cures the resin, and repeats this operation plural times before forming the given three-dimensional structure. The finished three-dimensional structure is formed of resin, therefore if it is sintered, an electronic component cannot be produced. If an electrode or a member for forming an electronic component such as ceramic is added to this kind of photo-sensitive resin, it becomes difficult to cure this subject with light.

Japanese Patent Application Non-examined Publication No. H02-415702 discloses a method of forming a three-dimensional structure using inkjet. This method deposits a first layer of powder material at a limited area, then deposits binder at a selected area of the powder material layer, so that the bound powder material is formed at the selected area before a component is produced. This method repeats the foregoing operation selected number of times for producing a given plastic component. Thus a successive layer is formed at the selected area of the bound powder material. Then unbound powder material is removed, whereby a three-dimensional structure is formed. However, in the case of the disclosure discussed above, the inkjet apparatus jets binder for powder, and the binder does not include the powder. When the three-dimensional structure is taken out, surplus powder should be brushed off. Further, this disclosure has difficulty for forming a three-dimensional structure including plural members such as ceramic, electrodes and so on, which are necessary for an electronic component.

SUMMARY OF THE INVENTION

A base layer described in a method of manufacturing base layer, ink for inkjet and electronic components in accordance with the present invention contains at least 0.01 weight % of a component, which reacts with an additive component of organic substance included in the ink to cause gelling, and burns off at a temperature not lower than 300° C.

An ink for inkjet apparatus described in a method of manufacturing base layer, ink for inkjet and electronic components in accordance with the present invention contains at least 0.01 weight % of a component, which reacts on additive component of organic substance included in base layer to produces gelling, and burns off at a temperature not lower than 300° C.

A method for manufacturing electronic components described in a method of manufacturing base layer, ink for inkjet apparatus and electronic components in accordance with the present invention is a method of manufacturing electronic components using an inkjet apparatus, the manufacturing method includes the steps of improving the surface of printing object by providing the surface with a base layer in order to make the surface to be ink acceptable, and forming a certain specific pattern on the base layer by applying the ink with inkjet apparatus. At least either one of the base layer and the jet-ink contains a compound which produces gelling through a chemical reaction or a mutual reaction.

The above-described method of manufacturing a base layer, an ink for inkjet apparatus and electronic components in accordance with the present invention offers a substantial advantage in the production of electronic components, among other industrial sectors.

DETAILED DESCRIPTION OF THE INVENTION

Exemplary Embodiment 1

Figure 1A:
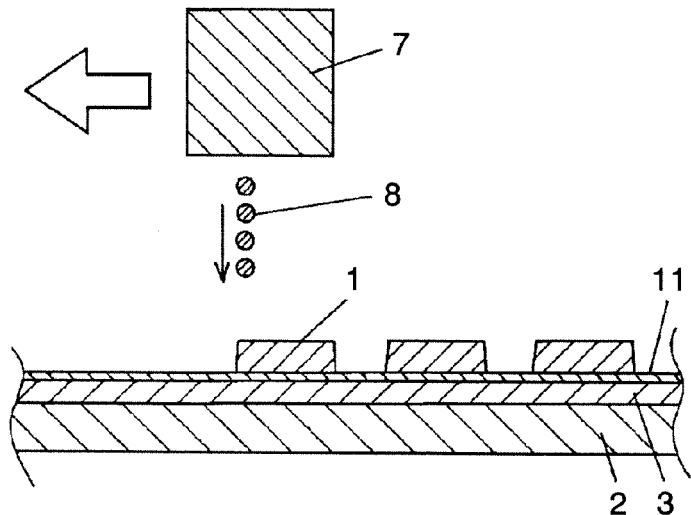
FIG. 1A shows a sectional view of formation of an electrode pattern on a base layer in accordance with a first exemplary embodiment of the present invention.
Figure 1B:
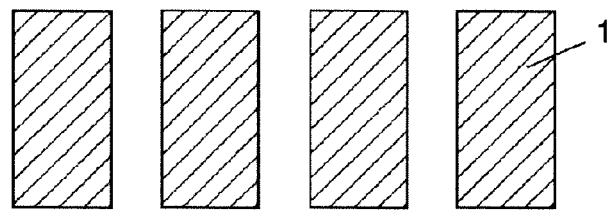
FIG. 1B shows a sectional view of the formation of the electrode pattern on the base layer in accordance with the first exemplary embodiment of the present invention.
Figure 1C:
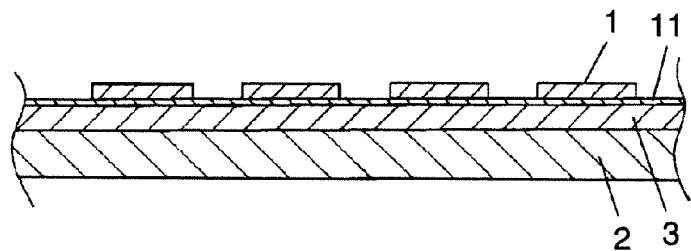
FIG. 1C shows a sectional view of the formation of the electrode pattern on the base layer in accordance with the first exemplary embodiment of the present invention.

In this embodiment, formation of an electrode pattern onto a ceramic green sheet is demonstrated. FIG. 1A-FIG. 1C illustrate a method of forming an electrode pattern on the surface of a ceramic green sheet having a base layer. FIG. 1A shows a sectional view illustrating a method of forming a given electrode pattern by inkjet method on a ceramic green sheet having a base layer. FIG. 1B shows the given electrode pattern thus formed. In FIG. 1A inkjet apparatus 7 is loaded with predetermined ink, and jets droplet 8 responsive to an external signal. The external signal can adjust not only jetting of droplet 8 but also a size (volume, quantity and diameter) of droplet 8. On base film 2, ceramic green sheet 3 is formed, and on top the surface of sheet 3, burn-off base layer 11 that is a feature of the present invention is formed. According to the present invention, plural droplets 8 jetted from inkjet apparatus 7 land on burn-off base layer 11 and form a given electrode-ink-pattern 1.

An example of the electrode pattern thus formed on the ceramic green sheet is shown in FIG. 1B, in which electrode pattern 1 free from oozing is accurately formed as the design requests. FIG. 1C is a sectional view cut along a line at anyplace in FIG. 1B. As shown in FIG. 1C, electrode pattern 1 according to the present invention is formed in an uniform thickness on burn-off base layer 11.

Burn-off base layer 11 of the present invention is formed on the surface of ceramic green sheet 3, whereby droplet 8 after it landed on green sheet 3 is not flowed or repelled due to the gravity or the surface tension (the surface tension of the surface of ink, the surface tension of the base layer.) Burn-off base layer 11 of the present invention is burnt off in a baking step prepared later and disappears, so that it does not adversely affect the reliability of the finished electronic component.

To be more specific about the foregoing method, ceramic green sheet 3 used in the first embodiment is formed by applying ceramic slurry onto resin film such that the solid content of the slurry becomes a thickness of several microns. The ceramic slurry is produced by mixing and dispersing ceramic powder, of which temperature characteristic shows B of EIAJ standard, and made of mainly barium titanate into mixed solution including butyl acetate, phthalate plasticizer, and butyral resin.

Figure 11A:
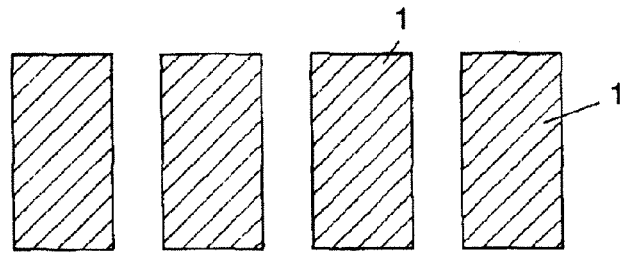
FIG. 11A shows a plan view of a required electrode pattern.
Figure 11B:
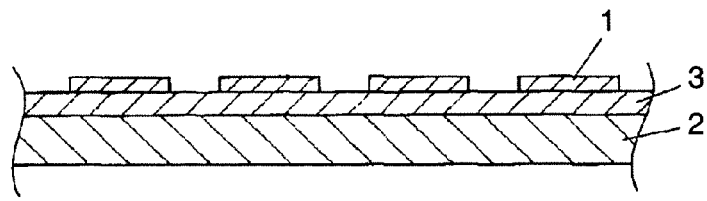
FIG. 11B shows a sectional view of the required electrode pattern.
Figure 11C:
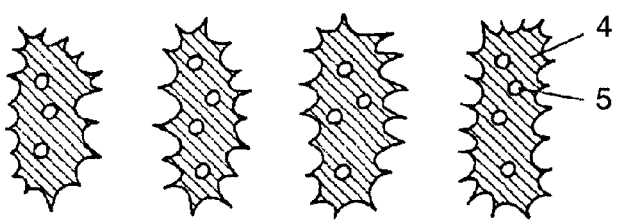
FIG. 11C shows a plan view of an electrode pattern formed by a conventional method.
Figure 11D:
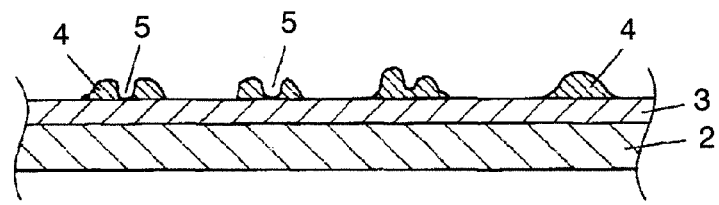
FIG. 11D shows a sectional view of the electrode pattern formed by a conventional method.

Next, an inkjet apparatus available in the consumer market prints the given electrode pattern 1 with commercial water soluble black ink on the ceramic green sheet 3. The result is shown in FIG. 11C. The ink lands on the ceramic green sheet and is repelled immediately like beads of water. As a result, target electrode pattern 1 cannot be formed. This is because the ceramic green sheet is not hydrophilic, and the water soluble ink landed does not soak into the surface of the sheet, but the ink is repelled by the surface tension of the base layer.

Thus water soluble resin is used as burn-off base layer 11, and the resin is dissolved in water and applied to the ceramic green sheet such that a dried thickness becomes 0.5 micron. In this embodiment, commercially available polyvinyl acetal (e.g., KW1 or KW3 manufactured by Sekisui Chemical Co. Ltd.) is used as water soluble resin. A commercially available inkjet apparatus jets the commercially available water-soluble black ink onto ceramic green sheet 3 on which burn-off base layer 11 is formed. The result is shown in FIG. 1B, i.e., accurate electrode pattern 1 free from deformation is obtained. Thus hydrophilic burn-off base layer 11 prepared on the poorly hydrophilic (highly water repellent) ceramic green sheet can prevent electrode pattern 1 from being deformed using water-soluble ink.

For the comparison purpose, the same test is done using a ceramic green sheet formed of water-soluble resin. Water-soluble polyvinyl acetal resin is dissolved in water, glycol (plasticizer), and alcohol (for adjusting a drying speed) to produce solution of water-soluble resin. The foregoing ceramic powder is mixed and dispersed into this solution to produce ceramic slurry. An applicator applies the slurry onto resin film such that a thickness of the slurry becomes several microns. The given electrode pattern 1 is printed on the surface of the slurry with the water-soluble black ink available in the market, then the water-soluble ink not only dissolves the water-soluble ceramic green sheet, but also deforms the electrode pattern, an eventually makes holes on the ceramic green sheet.

In other words, water-soluble jetted ink is repelled on the ceramic green sheet of non water-soluble, and water-soluble jetted ink on the water-soluble ceramic green sheet dissolves the sheet.

On the other hand, when non water-soluble (i.e., poorly ink acceptable) ceramic green sheet demonstrated in this embodiment is equipped with a thin hydrophilic burn-off base layer 11 on its surface, the green sheet obtains ink acceptability for water-soluble jetted ink and prevents the jetted ink from soaking into the sheet.

Next, a trial product of ink supposed to be used in an inkjet apparatus is employed in a similar experiment. The ink is made of nickel particles, which is turned into jet-ink using a method of manufacturing water-soluble ink, the method is disclosed in Japanese Patent Application Non-examined Publication No. H11-102615. The ink thus manufactured is used for printing on both surfaces of ceramic green sheet 3 and burn-off base layer 11 provided on top of sheet 3 using inkjet apparatus 7. On the sheet 3 of non water-soluble, the ink is greatly repelled and deformed due to water repellency of the surface. If water-soluble ceramic green sheet is used, the ink dissolves the sheet. On the other hand, on the surface of the burn-off base layer, the ink is not repelled but formed into a uniform thickness accurately. Being left for long hours, the ink keeps its pattern free from deformation.

Prepare several hundreds of ceramic sheets, each having burn-off base layer on which electrode pattern 1 is formed, then laminate 300 sheets such that electrode pattern 1 shifts by a given distance. Cut the 300 sheets into squares of 2.5 mm×1.6 mm size, then bake the cut pieces, and finally form electrodes to complete laminated ceramic capacitors. The laminated ceramic capacitor thus manufactured is excellent in both initial properties and reliability. A scanning electron microscope cannot observe burn-off base layer 11 on a cross section of this capacitor, because the base layer of the present invention is burn off. The burn-off base layer made of mainly burn-off material such as resin is burn off and volatilized during the baking, and does not remain in the finished electronic component, thus the base layer does not adversely affect the finished product.

In a case of forming burn-off base layer 11 of only resin, the thickness of the base layer is preferably not more than 20 microns, and more preferably it is not more than 5 microns. If the thickness of burn-off base layer 11 made of mainly resin is not less than 20 microns, defectives such as inter layer peeling occur in some products. Adding a ceramic member inside burn-off base layer 11 is effective to prevent the inter layer peeling.

Exemplary Embodiment 2

Advantage of Reducing Unevenness

In the foregoing first embodiment, it is demonstrated that electrode pattern 1 is formed on the ceramic green sheet on which burn-off base layer 11 is prepared. In this second embodiment, it is demonstrated that uneven thickness of electrode film applied depends on the presence of burn-off base layer 11.

Figure 2A:
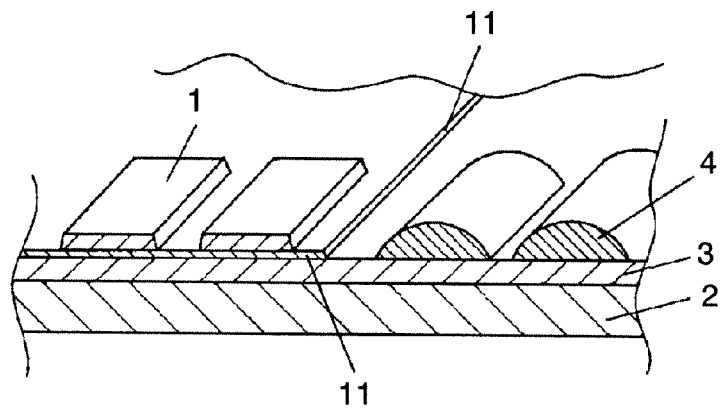
FIG. 2A shows a perspective view of an electrode pattern with a base layer and that without a base layer.
Figure 2B:
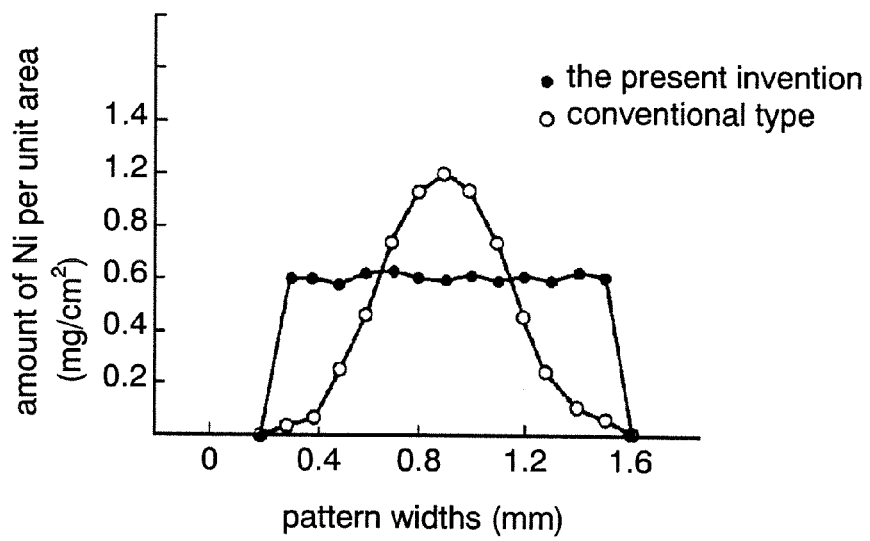
FIG. 2B shows characteristics of the electrode pattern with the base layer and that without the base layer.

FIG. 2A illustrates a case where burn-off base layer 11 is formed on only parts of the surface of ceramic green sheet 3. The advantage of burn-off base layer 11 is described using FIG. 2A, which shows a uniform thickness at an area where burn-off base layer 11 is formed and greatly uneven thickness at electrode patterns 4 formed directly on the ceramic green sheet without base layer 11. FIG. 2B shows the thicknesses of electrode patterns 1 and 4 shown in FIG. 2A measured with fluorescent X-ray. In FIG. 2B, the X-axis represents pattern widths (mm) and the Y-axis represents applied amount of Ni per unit area (mg/mm$^2$). The spot diameter of the fluorescent X-ray is 0.1 mm which increases resolution in measuring. In FIG. 2B, black circle ● indicates the electrode pattern with the burn-off base layer proposed by the present invention and corresponds to electrode pattern 1 shown in FIG. 2A. In FIG. 2B, white circle ○ indicates the electrode pattern without burn-off base layer 11 and corresponds to electrode pattern 4 with uneven thickness shown in FIG. 2A.

As shown in FIG. 2B, in the case of burn-off base layer 11 of the present invention being available, an uniform thickness is obtained overall the pattern. On the other hand, in the case of burn-off base layer 11 being not available, a little amount of Ni is applied around electrode pattern 4 but a greater amount of Ni is applied at the center of electrode pattern 4. Thus substantially uneven application is observed in the axial direction.

Figure 3A:
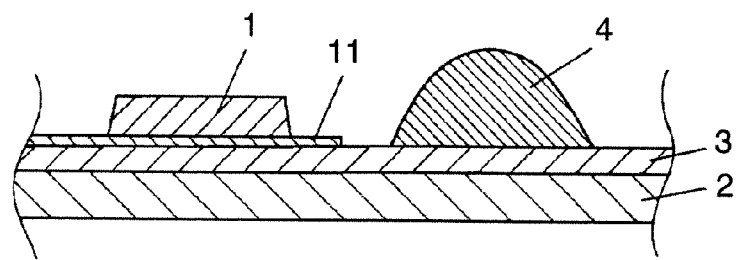
FIG. 3A shows a sectional view illustrating an electrode pattern with a base layer and that without a base layer due to drying.
Figure 3B:
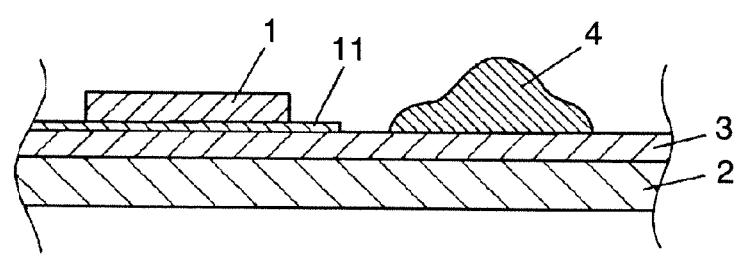
FIG. 3B shows a sectional view illustrating an electrode pattern with a base layer and that without a base layer due to drying.
Figure 3C:
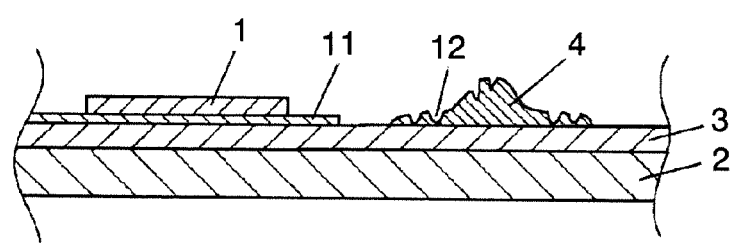
FIG. 3C shows a sectional view illustrating an electrode pattern with a base layer and that without a base layer due to drying.

Next, the uneven application discussed above is detailed using FIG. 3, which monitors drying procedure of electrode patterns 1 and 4 shown in FIG. 2A with sectional views. On the left sides (burn-off base layer 11 is available) of FIG. 3A-FIG. 3C, a droplet (not shown) jetted from an inkjet apparatus (not shown) lands on burn-off base layer 11 and forms pattern 1 as shown in FIG. 3A, and solvent component in the ink is volatilized with a lapse of time. Then the ink is gradually dried and thinned keeping the uniform thickness and the shape shown in the sectional view as shown in FIG. 3B and FIG. 3C.

On the other hand, in the right area where burn-off base layer 11 is not formed, a droplet (not shown) landed on the ceramic green sheet of water repellency is repelled as if a bead of water, as shown in FIG. 3A, due to the water repellency of the surface. Its cross section shows a rise at the center. A peripheral section where the thickness of electrode pattern 4 is the thinnest among other sections starts volatilizing, and other sections follow. The center section having the greatest thickness remains escaping being dried to the end. At this time, the ink in liquid condition (not dried yet) is pulled by the surface tension to the center section, thus cracks 12 and pinholes (not shown) tend to occur between the peripheral and center sections. Electrode pattern 4, where such an uneven thickness occurs, is not suitable for manufacturing electronic components of high performance required from the market.

Figure 5:
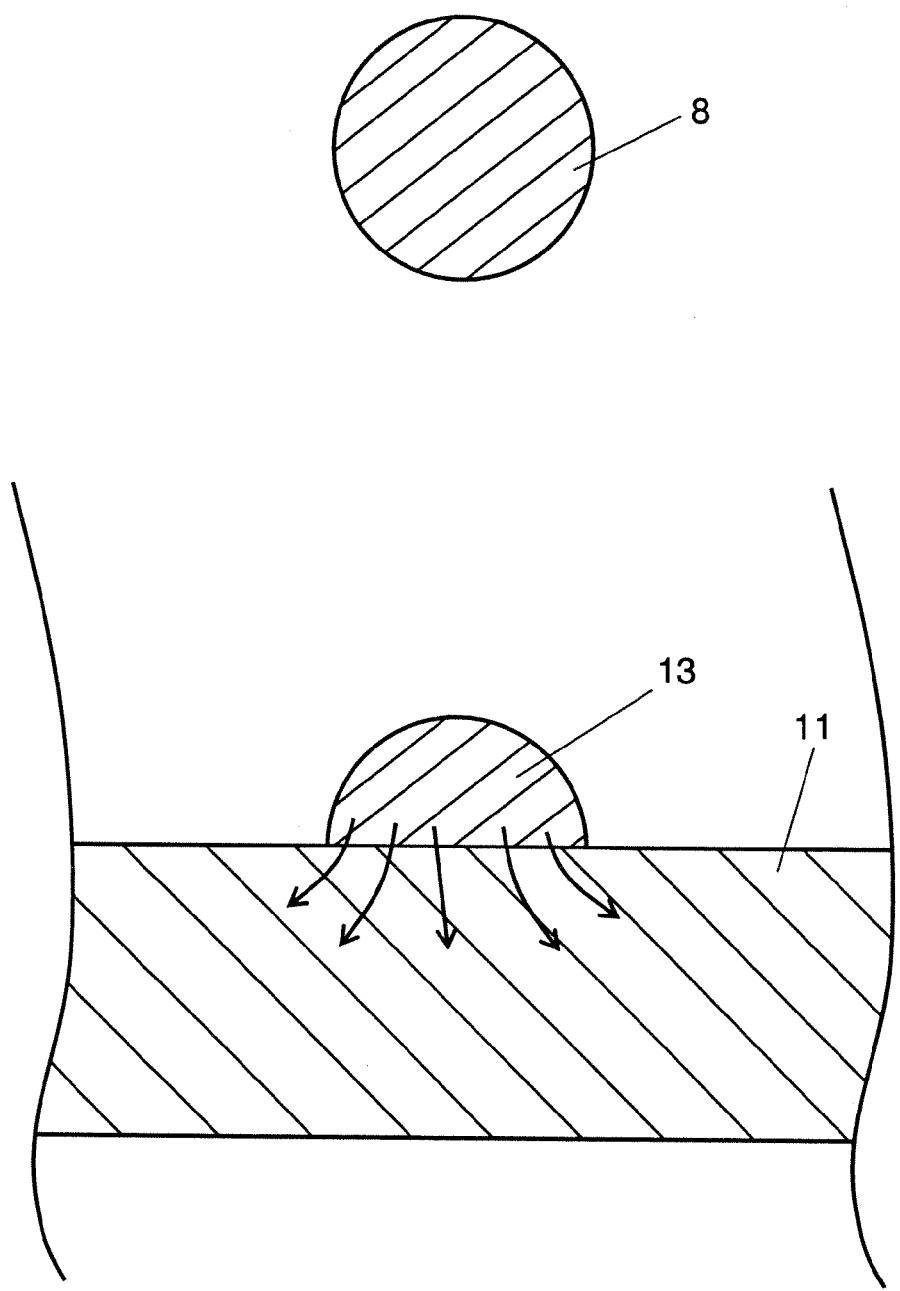
FIG. 5 illustrates that solvent contained in ink soaks into a base layer, whereby the ink is set.
Figure 6A:
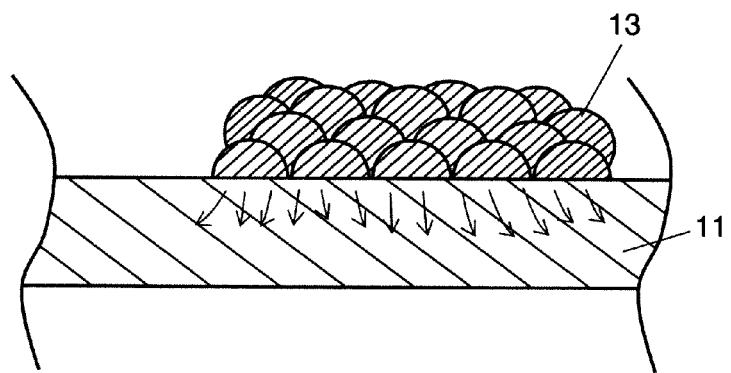
FIG. 6 illustrates that solvent contained in ink soaks into a base layer, whereby the ink is set.
Figure 6B:
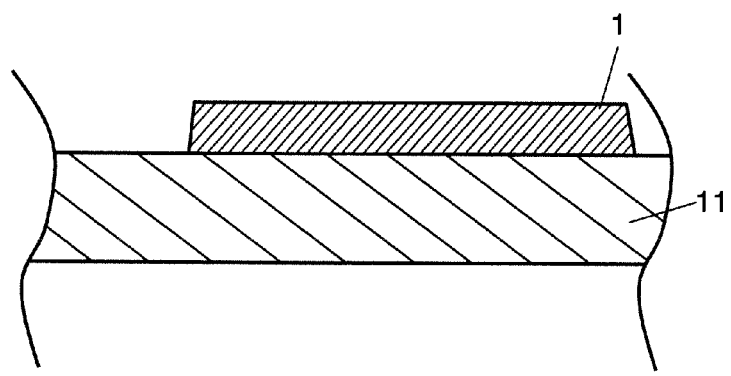

Next, a phenomenon, in which solvent component in the ink soaks into the burn-off base layer, is explained as follows: FIG. 5 and FIG. 6 illustrate that the solvent component in the ink is absorbed in the burn-off base layer thereby setting the ink. In FIG. 5, droplet 8 jetted from the inkjet apparatus (not shown) lands on burn-off base layer 11 and forms landed droplet 13. At this time, some solvent component out of droplet 8 soaks into base layer 11 along the arrow marks. FIG. 6A and FIG. 6B show a printing procedure. In actual, thousands or millions of droplets 8 per second are jetted from the inkjet apparatus (not shown), and landed droplets 13 are piled up on the sheet as shown in FIG. 6A to produce a given thickness. In this case, some solvent component from plural landed droplets 13 are absorbed into base layer 11 along the arrow marks. Landed droplets 8, from which some solvent is removed, increase their viscosity and are integrated with each other to form electrode pattern 1 shown in FIG. 6B. In a case of printing on a regular paper with the inkjet, the ink is completely absorbed into the paper because the ink is dye ink. However, according to the present invention, ink including powder material is used and the sheet has low absorption of ink. In such a case, a highly accurate pattern is obtainable only after the burn-off base layer is formed, which is proposed by the present invention.

Exemplary Embodiment 3

In the foregoing second embodiment, reducing uneven thickness using burn-off base layer 11 is described. In this third embodiment, uneven thickness of an applied film is further reduced using chemical reaction between burn-off base layer 11 and ink. In this embodiment, the burn-off base layer contains organic carboxylic acid.

First, as the material of burn-off base layer 11, employ anionic polyvinyl alcohol resin (manufactured by KURARE Inc.), and dissolve the resin in pure water. Then apply the resin dissolved in the pure water onto ceramic green sheet 3 such that a thickness of dried resin becomes 0.5 micron. Burn-off base layer 11 of anion resin is thus formed.

Figure 4A:
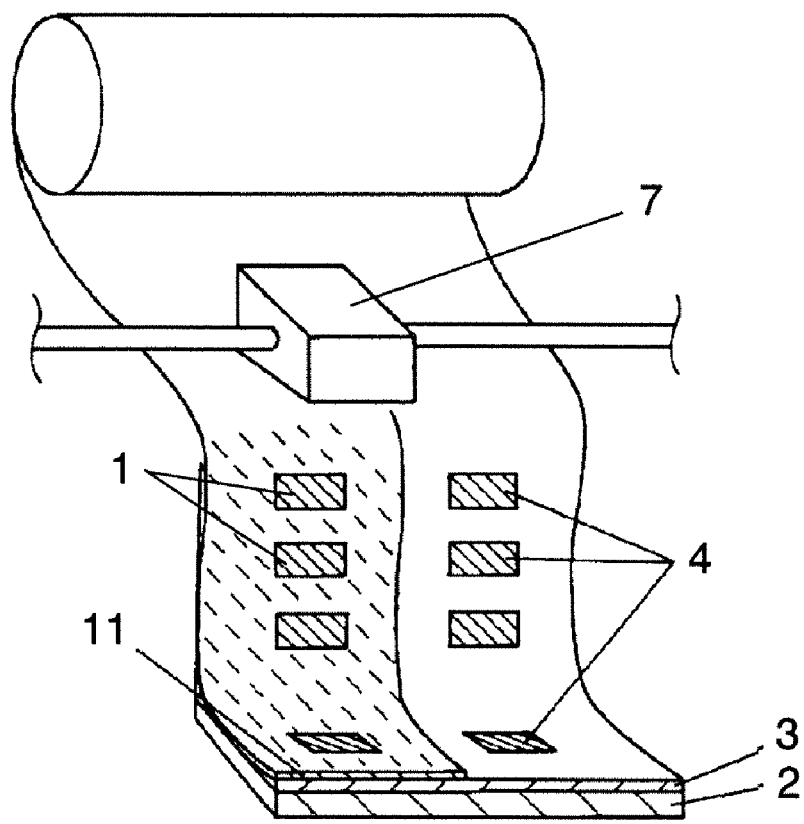
FIG. 4A illustrates a status when a printer discharges a sheet.
Figure 4B:
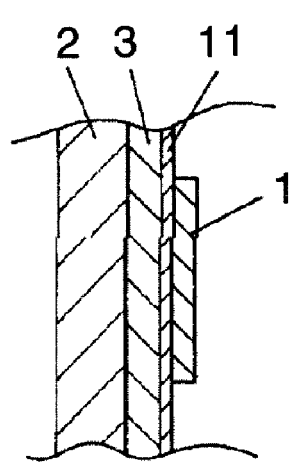
FIG. 4B illustrates a status when a printer discharges a sheet.
Figure 4C:
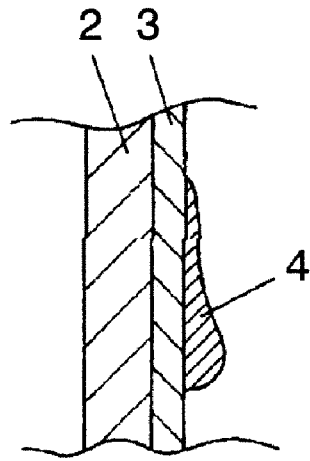
FIG. 4C illustrates a status when a printer discharges a sheet.

Next, as the material of ink, dissolve nonionic polyvinyl alcohol resin manufactured by KURARE Inc. in pure water. Then add some nonionic dispersant, nonionic plasticizer (glycerin, polyethylene glycol are used) and Ni powder to the resin dissolved in the pure water. Nonionic ink is thus produced. Load the nonionic ink into a printer (made by EPSON Inc., model No. MJ510C) and print patterns in 720 dpi. FIG. 4 illustrates this printing. In FIG. 4C, the ceramic green sheet on which electrodes are printed is discharged from the printer in a slanted manner, so that the ink flows in the electrode pattern and uneven print tends to occur.

In this third embodiment, electrode pattern 1 is formed on burn-off base layer 11; however, uneven print due to the ink flow does not occur. Because at the instant when nonionic ink lands on anionic burn-off base layer 11, a kind of gelling reaction between nonion component in the ink and anionic base layer 11 starts, which prevents the landed ink from flowing.

This situation is detailed with reference to FIG. 4. As shown in FIG. 4A, burn-off base layer 11 is formed on the left half of ceramic green sheet 3, on which electrode patterns are to be printed. Inkjet apparatus 7 prints given electrode patterns on sheet 3 at both the areas, one has base layer 11 and the other does not have. FIG. 4B shows electrode pattern 1 printed on burn-off base layer 11, where the ink does not drain although sheet 3 is held vertically with the ink still wet. In other words, non-uniform thickness does not occur. FIG. 4C, on the other hand, shows a status without burn-off base layer 11, where the ink of the patterns drains downward when sheet 3 is held vertically with the ink still wet.

In the case of using the burn-off base layer made of nonionic resin, the same material as the ink, the ink is formed accurately; however, a pattern formation by the inkjet apparatus onto the base layer causes the ink to drain in the pattern as shown in FIG. 4C. This phenomenon occurs when an electrode pattern still wet is placed vertically as shown in FIG. 4A or the ink is jetted onto the sheet vertically held. Then the ink drains in the pattern due to its own weight or non-uniform thickness occurs in the pattern. On the other hand, in the case of using the burn-off base layer made of anionic resin, a pattern formation on to the base layer does not cause the ink to drain in the pattern or non-uniform thickness does not occur in the pattern, although an electrode pattern still wet is placed vertically or the ink is jetted onto the sheet vertically held.

According to the present invention, reaction between a component included in the burn-off base layer reacts and a component included in the ink allows the pattern formed on the base layer to keep its shape accurately before the solvent component volatilizes. In other words, even if the wet ink landed on the burn-off base layer is put in a drier and blown by volume hot air at a high speed, the printed pattern or its cross sectional shape is not adversely affected. Thus the manufacturing method of the present invention allows a drier to be placed in conjunction with the inkjet apparatus, and this structure can save the manufacturing equipment a lot of space.

A use of the advantage of the present invention in commercially available and high-speed inkjet printers, which employ various high-speed heads, allows jet-ink used for various electronic components to be dried free from adverse influence to their cross sectional shapes. The advantage is applicable in a high speed printing such as several meters per minute or several-hundred meters per minute. Since the present invention can print electrode patterns free from uneven thickness on a sheet held vertically, a floor space for the printing apparatus can be reduced, and the printing apparatus can be integrated into another apparatus with ease. This advantage allows simplifying the apparatus, lowering the cost, and providing a clean room with ease. As a result, finished products can be manufactured at a reasonable cost and the yield ratio can be improved.

As discussed above, the material added to the ink and the material added to burn-off base layer 11 contact with each other to start gelling reaction, thereby curing the ink instantaneously. High strength of cured ink is not required in this curing reaction, but soft curing or gelling that can prevent the ink from draining is good enough. A combination of the two materials is, e.g., anionic material with nonionic material, anionic material with cationic material, nonionic material with cationic material. Reactions between those materials are described as a reaction between a donor and an acceptor in the fourth embodiment and onward.

The present invention finds that the dispersant can be used for starting the gelling reaction. For instance, polycarboxylic acid based dispersant of anionic material, made by KAO inc. or SUN-NOPCO and available in the market, is used for producing ink, and nonionic resin is used as the burn-off base layer. In this case, a similar reaction to what is discussed above can be expected. This chemical reaction is considered similar to the gelling reaction proper to water-soluble resin, i.e., the gelling reaction between polyvinyl-alcohol-based synthetic starch available in the market being mixed with borax. Materials such as borax containing sodium or boric acid leave residual component, which affects reliability of the electronic component, after the material is baked. Therefore those materials are not good for burn-off base layer 11 of the present invention.

It is desirable to use organic acid or organic base which does not produce residual component after the baking for realizing the manufacturing method of the present invention. Several ten thousands of such organic substances are known in the world, and an ordinarily skilled person in the organic chemistry can optimize those materials with ease. According to the experiments by the inventors, an organic acid which includes at least carboxyl group (—COOH) is useful from the view point of reliability.

Resin including carboxylic acid is used as either one of the ink or the burn-off base layer, and resin or organic substance of cationic or nonionic one is used as the other one (base layer or ink), whereby the gelling reaction can be produced. Any organic compound R—COOH having carboxyl group can be the resin containing carboxylic acid where R represents hydrocarbon group and can be used for the present invention.

This reaction is considered similar to a kind of salt out reaction. In the present invention, in the case of producing metal salt, such as sodium, of alkaline material or alkaline earth material, residuals after the baking sometimes affect adversely to reliability. Thus addition compound of organic base and acid, or organic substance is preferably produced instead of metal salt from the salt out reaction.

Besides ceramic member in the burn-off base layer, conductive powder or magnetic powder can be added, so that the base layer becomes more functional. For instance, the materials proposed here to be used in the burn-off base layer can be added to the ceramic slurry which is the material of a ceramic green sheet or an unbaked ceramic member. In other words, the material supposed to react on the ink is added to the ceramic green sheet or unbaked ceramic member in advance, so that a ceramic green sheet having higher ink-acceptability can be produced.

In the present invention, the ink preferably has a viscosity of less than 2 poise. In the case of viscosity not less than 2 poise, an inkjet apparatus available in the market clogs sometimes with the ink. The best way to prevent the inkjet apparatus from clogging is to dilute the ink with water-soluble solvent such as water or glycol; however, the thinner ink tends to produce uneven print on the sheet. The manufacturing method of the present invention uses chemical reaction between the sheet and the ink, therefore, even if the ink is diluted, uneven print can be suppressed, and the ink can be dried fast.

Exemplary Embodiment 4

Figure 7:
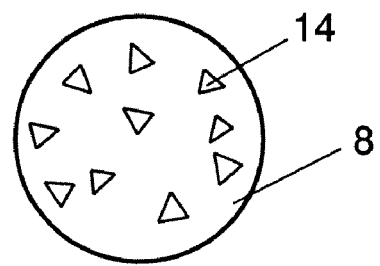
FIG. 7 illustrates a case where gelling reaction is used.
Figure 7:
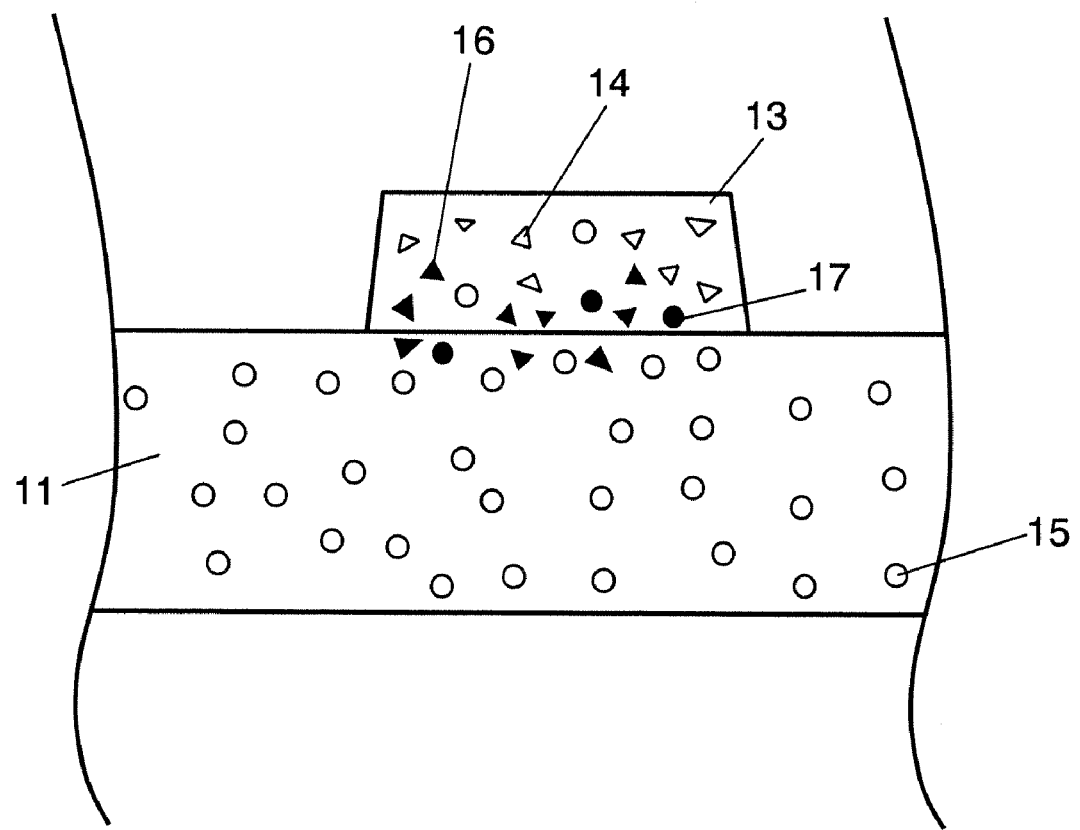

In this fourth embodiment, the gelling reaction, produced by landing the jet-ink on the burn-off base layer, is described with reference to FIGS. 7 and 8. As shown in FIG. 7, reactive members are added to the ink and the base layer in advance. The reactive member in the ink and that in the base layer contact with each other to start gelling reaction, thereby setting the ink. The ink forming droplet 8 includes in advance donor 14 corresponding to the reactive member, and base layer 11 includes in advance acceptor 15 corresponding to the reactive member. In the case of FIG. 7, droplet 8 including donor 14 lands on base layer 11 which includes acceptor 15, then donor 14 and acceptor 15 react with each other, which produces reacted donor 16 and reacted acceptor 17. Reacted donor 16 and reacted acceptor 17 start gelling the ink. As shown in FIG. 7, after the gelling, there still remain unreacted donors 14 and unreacted accpetors 15 in landed droplet 13. Those unreacted donors 14 and acceptors 15 remained in the droplet 13 can increase the thickness, volume, amount and weight of landed droplet 13 as shown in FIG. 6.

Figure 8:
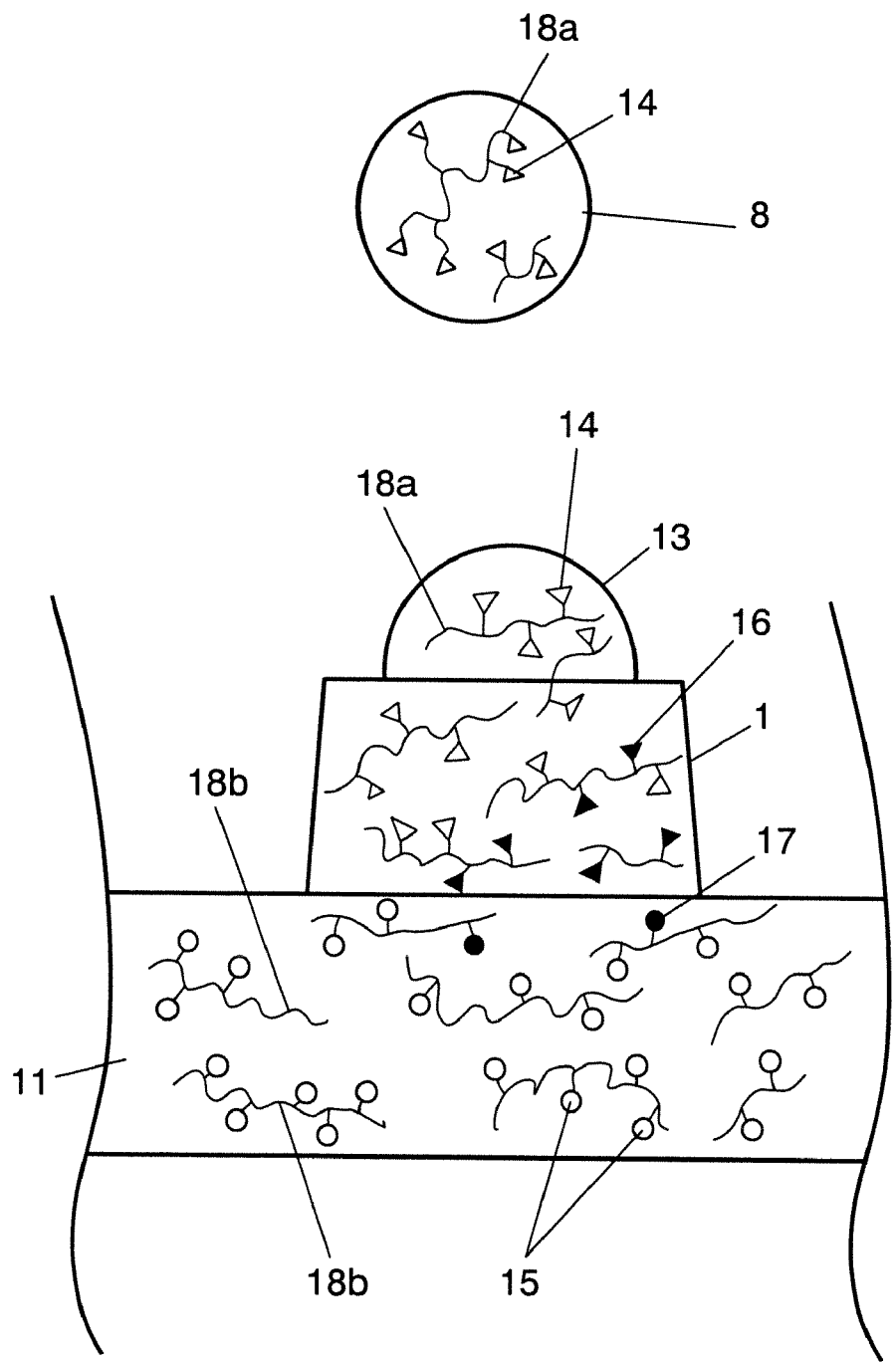
FIG. 8 illustrates a case where reaction between organic components.

Next, the theory of reducing uneven print is demonstrated with reference to FIG. 8, which illustrates a case where a reaction between organic components is used. In this fourth embodiment, an organic component added to the ink and an organic component added in advance to the base layer react with each other, which starts gelling and sets the ink. In FIG. 8, among organic substance 18 such as resin or dispersant, resin 18a included in droplet 8 contains donor 14 as a functional group. Organic substance 18b included in base layer 11 contains acceptor 15 as a functional group. In this embodiment, droplet 8 lands on burn-off base layer 11 to form landed droplet 13. Then donor 14 of resin 18a in droplet 13 and acceptor 15 of organic substance 18b in base layer 11 produce gelling reaction.

Exemplary Embodiment 5

In the fifth embodiment, plural inks are used, i.e., one jet-ink containing non-burn-off material (hereinafter called non-burn-off ink) and another jet-ink containing burn-off material (hereinafter called burn-off ink). A given pattern is printed on one base using the non-burn-off ink and the burn-off ink alternately. This operation is repeated plural times to form a three-dimensional structure. According to the present invention, the members reactive with each other (e.g., donor and acceptor) are added to the non-burn-off ink and the burn-off ink respectively, so that the inks start gelling upon contacting with each other, which eliminates a step of drying the inks. Thus the inks do not mix with each other and are free from draining or oozing, and can form a given three dimensional structure. The structure thus formed is dried and baked, whereby the part formed by the burn-off ink is burnt off and volatilized. The non-burn-off material in the non-burn-off ink contained in the three dimensional structure remains as it is and is sintered to form the given structure.

Figure 9:
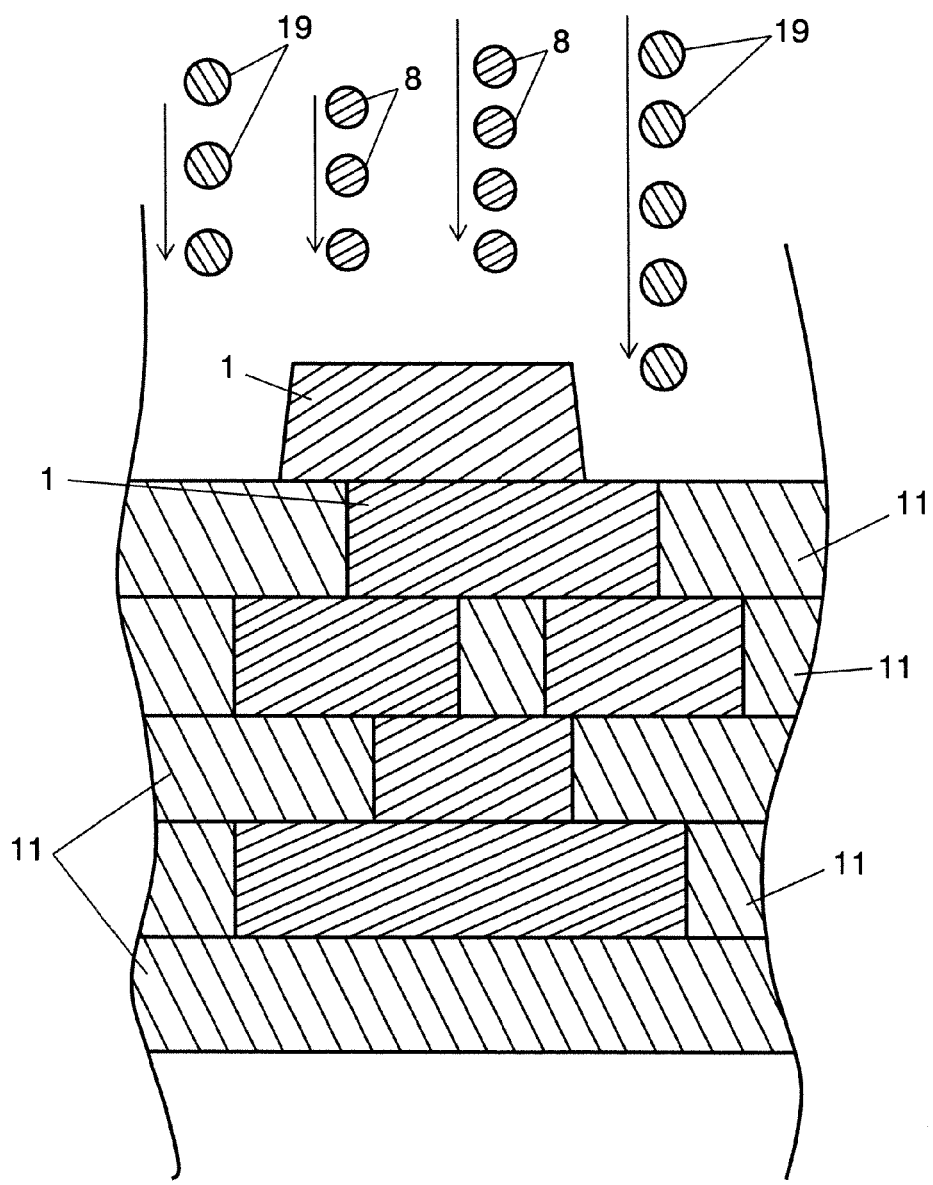
FIG. 9 illustrates a case where reaction between inks thereby forming a three dimensional structure.

FIG. 9 illustrates a case where a reactive member is added to the jet-ink to form a three dimensional structure. In FIG. 9, droplets 19 to the base layer form burn-off layer 11 after the landing. Droplets 8 jetted from the inkjet apparatus (not shown) land and form electrode pattern 1. Droplets 19 jetted from the inkjet apparatus also land and form burn-off base layer 11. In this embodiment, droplets 8 and droplets 19 contact with each other after the landing and start gelling as discussed in the previous embodiments, therefore, the patterns do not ooze to each other. On top of the patterns thus gelled, new patterns are further formed, as shown in FIG. 9, with droplets 8 and 19 jetted from the inkjet apparatus, thereby forming a three dimensional structure. The structure thus formed is finally dried and baked, so that the part formed by droplets 8 remains as the three dimensional structure and the part formed by droplets 19 is burnt off. The three dimensional structure can be thus manufactured. Particularly in this embodiment, just before the baking, burn-off base layer 11 as a protective member protects the three dimensional structure until it is baked. The three dimensional structure can be also formed being buried in the base layer. Therefore if more complicated and elaborate work is required in a three dimensional structure, this method can manufacture it precisely and in accurate dimensions.

The baking of a three dimensional structure sometimes causes burning shrinkage in the structure by 10 to 50% depending on a baking condition. In such a case, the three dimensional CAD pattern is revised responsive to the shrinkage ratio. Particularly in this embodiment, molds are not used, and three dimensional structure can be directly formed by the inkjet. Thus only a change of dimension in the three dimensional CAD can revise a burning shrinkage ratio, so that a highly accurate structure can be formed in a short time.

Material hard to be sintered such as ceramic members including alumina or zirconia can be added to the burn-off base layer, so that a three dimensional structure is not loosen or deformed during the baking.

Exemplary Embodiment 6

In the sixth embodiment, non-burn-off materials different from each other are put respectively into different inks reactive with each other, and a given pattern is formed on a single base using these inks. This operation is repeated plural times to form a three dimensional structure. Particularly in this embodiment, reactive members with each other are put in the respective inks, so that the inks still wet do not mix with each other and are free from draining or oozing. As a result, a three dimensional structure still wet or in gel status can be formed. The three dimensional structure thus formed is dried and baked, whereby the three dimensional structure made of the non-burn-off materials different from each other is formed.

Figure 10:
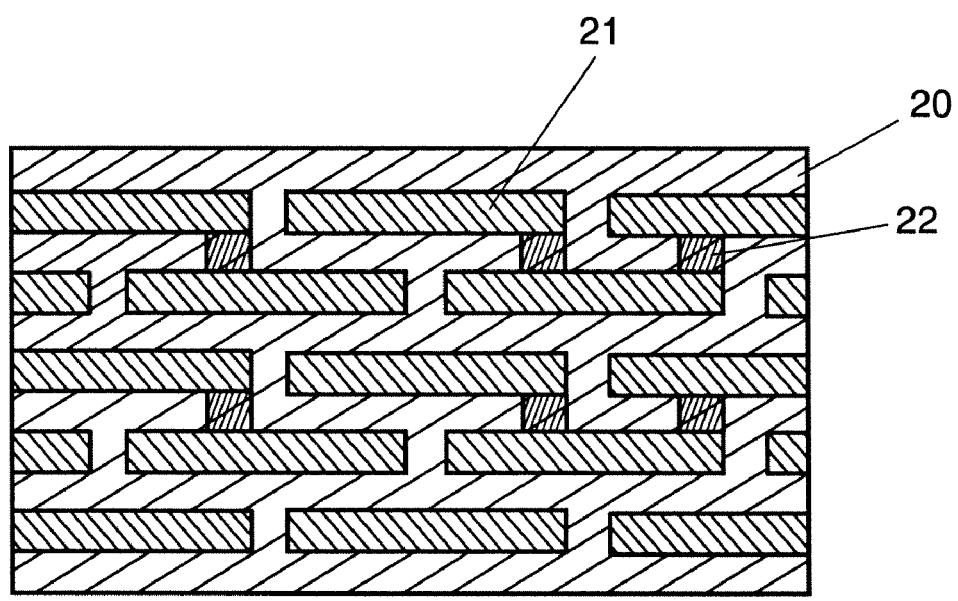
FIG. 10 illustrates a sectional view of a three dimensional structure formed in an exemplary embodiment of the present invention.

FIG. 10 shows a sectional view of the three dimensional electronic component produced in accordance with the sixth embodiment. As shown in FIG. 10, ink (not shown) for ceramic lands and forms ceramic 20, ink (not shown) for electrode lands and forms electrode 21, and ink (not shown) for via hole lands and forms via hole 22. The three dimensional structure thus formed is then baked at a given temperature, and external electrodes are formed before it is completed as a given electronic component. In the sixth embodiment, donors or acceptors are added individually to the respective inks for ceramic, electrode and via hole. Thus those inks are gelled to avoid mixing with each other, and a required printed structure can be formed.

As the ink for forming ceramic 20, the following materials such as glass, dielectric body, magnetic body, or ceramic can be used as far as they are oxide.

Exemplary Embodiment 7

In the seventh embodiment, the reactive member is described, which is to be used for forming a three dimensional structure using ink and burn-off base layer, or plural inks. In this embodiment, donors are added to ink and acceptors are added to the burn-off base layer. The donor and acceptor are reactive with each other. At the moment when the ink including the donors lands on the base layer which includes the acceptors, the donors and acceptors react with each other. Thus the landed ink is prevented from draining. As a matter of course, when the ink contains acceptors and the burn-off base layer contains donors, draining of the ink is also prevented. In this embodiment, for the purpose of simple description, the reactive member contained in the ink jetted from a printer head is called donor, and the reactive member contained in the ink accepting side is called acceptor.

Exemplary Embodiment 8

In the eighth embodiment, a salting out member is used in donors and acceptors that produce gelling reaction. First, anionic PVA is dissolved in water, and this water solution is applied and dried as a burn-off base layer of anionic material. To be more specific, PVA is modified by carboxylic group, meanwhile this member is purchased from KURARE Inc. The ink is made of a given powder with additive of nonionic or cationic material. Then an inkjet apparatus jets the ink onto the base layer of anionic material to form a given pattern. At the instant when the ink lands on the base layer, the ink reacts on anionic resin of the base layer and starts gelling. In this case, the water solution of anionic PVA is made of commercial anionic PVA in a quantity of 1 to 50 g, dissolved in the pure water of 100 g. If the amount of PVA is less than 1 g, the concentration of resin solution is too low and a necessary film thickness sometimes cannot be obtained. If the amount of PVA is not less than 50 g, the viscosity of the resin solution is too high and it is hard to apply the solution. In the case of thinning the base layer thickness not more than 0.1 micron, or increasing the thickness of the ink not less than 10 micron, the absolute amount of the anionic resin contained in the base layer eventually becomes small, which lowers reactivity with the ink. In such a case, organic acid can be added to the anionic base layer, thereby strengthening the gelling reaction. For instance, dissolve anionic PVA available in the market of 1 g to 40 g into pure water of 100 g, and dissolve organic acid such as citric acid or lactic acid of 0.1 g to 10 g therein. The water solution thus produced is applied and dried to be the burn-off base layer. Other than anionic resin, formic acid, acetic acid, oxalic acid, citric acid and lactic acid can be used as organic acid. One of those organic acids only or combined with other water-soluble resin can produce a similar reaction. An effective amount to be added is 0.1 g to 10 g. A molecular weight of the organic acid is preferably 100 or more than 100. If the molecular weight is less than 100, the organic acid added to the base layer sometimes volatilizes and disappears automatically. If the organic acid is added to the anionic PVA, it sometimes causes gelling reaction to the PVA instead. To prevent this problem, it is preferable to add weak organic acid to weak acid water-soluble resin. Strong acid and weak acid are classified based on functional groups, and relevant literatures available in the market tell the classification.

As anionic materials, it is preferable to select the material including functional group such as NH—, OH—, $CO_3$—, $HCO_3$—, $CH_3CO_2$—, and the like. Dispersant, resin of phosphoric acid base, S—, HS—, or $HSO_4$— tends to attach to powder surface, and they are very useful as additive to the ink because those materials can increase dispersion and stability of the ink. Be cautious that an amount of those additive is preferably less than 1 g because too much additive would damage the oven during the baking or degrade the reliability of the product.

In the case of using water-soluble resin as burn-off base layer 11, the following materials can be used: polyvinyl acetal resin, polyvinyl alcohol resin, methyl cellulose resin, carboxy-methyl cellulose resin, hydroxy-propyl cellulose resin, and acrylic resin. The resins discussed above are added to one of jet-ink or the base layer, and organic acid or organic base is added to the other one, thereby producing the gelling reaction.

When metals such as nickel, in particular, is used in ink with resin or dispersant of carboxylic acid, the ink thus produced becomes weak acid, and nickel sometimes dissolves as ion to form supernatant liquid (nickel ion) of blue-green color. If the ink's pH is greater than 3, nickel dissolves a little and no serious problem occurs; however, if the pH is not more than 3 (particularly not more than 2), the nickel dissolves a lot, which degrades the properties of a laminated ceramic capacitor having an internal electrode made of nickel.

Exemplary Embodiment 9

In the ninth embodiment, a combination of acceptors and donors employs the members that cause gelling reaction. The difference in pH of a burn-off base layer from that of jet-ink is used to produce gelling reaction. For instance, first one uses acid of less than pH 7 and second one uses base of pH 7 or greater than pH 7, and acid-base reaction can be used. In a case of using an acid substance or a basic substance having a small molecular weight, gelling reaction does not occur and the ink stays water-soluble status. On the contrary, in a case of using the substance having a great molecular weight, e.g., more than 1000, neutralization reaction between the acid and base lowers the dissoluble concentration of that substance. Thus the substance cannot be hydrated completely, and parts of the substance separates out (deposits) in gelled status in the solvent. Meanwhile, a pH meter available in the market tells whether the ink or base layer is acidic, basic or neutral. Ink per se is set in a centrifugal separator, and fine particles in the ink precipitate, the supernatant liquid thus obtained can be used for measuring pH. To know the pH of the burn-off base layer, dip the base layer into pure water, and put it in a centrifugal separator to obtain supernatant liquid, which is used for measuring the pH. The super-natant liquid thus obtained can be concentrated upon request.

The inventors find that the difference in pH of the burn-off base layer from that of the jet-ink is preferably not less than 0.5 (more preferably not less than 1). When the difference in pH is not less than 0.5, polymeric materials, of which molecular weight is at least 1000, preferably more than several thousands or more than several ten thousands, can cause gelling reaction because of the difference of acid and base of their functional groups.

Exemplary Embodiment 10

In the tenth embodiment, a combination of acceptors and donors employs the members that cause chemical reaction. A selection of acidic or neutral burn-off base layer with respect to basic ink causes similar chemical reaction to what is discussed in the previous embodiments. For instance, dispersant including amino group or cationic dispersant is mixed into the ink to produce basic ink. Basic water-soluble organic solvent of various amines or dimethyl formanide (DMF) can be added to this ink, so that dispersibility and stability of the ink improve and also reactivity of the base layer increases.

Next, the case where amine is used as basic material is detailed hereinafter. Amine or amide used in one of the ink or the burn-off base layer can cause gelling reaction similar to that discussed in the previous embodiments. Meanwhile primary amine refers to $RNH_2$, secondary amine refers to $R_2NH$, and tertiary amine refers to $R_3N$. Any amines can be used in the present invention. R represents hydrocarbon. As for amide, any amide of primary amide, secondary amide and tertiary amide can be used in the present invention. For instance, ethanol amine can be used in either one of the ink or the base layer. Gelling reaction can starts when a basic material is used in either one of the ink or the base layer. In any cases, it is preferable to use pH not more than 12. If pH is 12 or more than 12, human skin can be corroded depending on handling the materials.

Exemplary Embodiment 11

In the eleventh embodiment, a combination of acceptors and donors utilizes solidifying reaction of protein. The present invention can utilize the solidifying reaction of protein. This reaction has been used in manufacturing "tofu" (bean curd). In the present invention, simple protein such as albumin and globulin, or gelatin, peptone, keratin, collagen can be used as protein.

Various proteins are available at a reasonable cost due to the recent progress of biochemistry, and proteins excellent in absorption to powder surface or binder component in ink are also available. In other words, protein component is mixed with ink, and setting agent such as gluconic acid is mixed with the burn-off base layer, so that the ink starts solidifying upon contacting of the ink and the base layer.

Further, biochemical aggregation, similar to the foregoing reaction and one of antigen-antibody reactions, can be used. This reaction refers to a phenomenon where hematid (red blood cell) in blood aggregates due to antibody reaction to antigen. In this embodiment, antigen or antibody bonded to the surface of synthetic resin particles can be used instead of putting hematid in the ink, so that high sensitivity of arregation is utilized. Thus a very little amount of such material can be useful in the present invention. Such materials are available at reasonable costs thanks to the recent progress of biochemistry. Materials excellent in absorption to powder surface or binder component in ink are also available.

Exemplary Embodiment 12

In the twelfth embodiment, a combination of acceptors and donors produces dehydrating reaction. Methanol, ethanol or other higher alcohol or acetone can be added in advance as dehydrating agent to burn-off base layer 11 in order to gel the ink mixed with water-soluble resin such as polyvinyl alcohol. At the instance when this water-soluble ink lands on base layer 11 including the dehydrating agent, the water component in the ink is removed and parts of the hydrated ink materials separate out (deposit) or thicken (body up). Thus the landed ink can keep its shape accurately. The reaction between the burn-off base layer and the ink proposed in the present invention can be satisfied with accompanying the gelling or the increase of viscosity. Therefore, milk commercially available can be used in the ink, and vinegar commercially available can be used in the burn-off base layer. It is generally known that when milk mixes with vinegar, the milk is gelled. In this case, the component emulsified and dispersed in the milk is broken. The present invention can utilize such agglutination reaction of emulsion.

Exemplary Embodiment 13

In the thirteenth embodiment, non-water-soluble resin is emulsified in water, and this resin is used instead of water-soluble resin. For instance, non-water-soluble resin such as polyvinyl-butyral is emulsified in the water with emulsifying agent. This product is commercially available. Such emulsifying results in a nonionic product, a cationic product or an anionic product depending on an emulsifying agent. A use of polarity difference in those emulsions thus obtained can cause gelling reaction similar to those discussed in the previous embodiments. For instance, when nonionic emulsion is mixed with anionic emulsion, the emulsions are broken and resin component separates out into the water solution. This kind of gelling reaction or separating reaction can be produced by, e.g., adding organic acid, organic base, or water-soluble anionic resin or cationic resin to nonionic emulsion.

Therefore, one of the emulsions discussed above is added to either one of the ink or the burn-off base layer, and the material reactive to this emulsion is added to the other one (ink or base layer), so that setting reaction or solidifying reaction occurs in colloid solution. Those reactions (gelling, separation of resin, increasing viscosity, precipitation) make an ink-shape printed by inkjet more precisely.

In a case of using latex resin or emulsion resin in burn-off base layer 11, a particle diameter of those materials is preferably not more than 5 microns (more preferably not more than 2 microns). If emulsion particles having diameter of not less than 5 microns are used in the ink, the printer head tends to clog, and when the particles are used in the base layer, they cause uneven thickness of the base layer. Thus the particle diameter not less than 5 microns is not suitable for manufacturing electronic components.

As discussed above, non-water-soluble resin can be used in the present invention, namely, water-soluble resin such as polyvinyl alcohol is used as emulsifying agent or protective agent to form emulsion. Anionic material containing carboxyl group can be used as emulsifying agent, so that anionic emulsion resin is produced. The anionic emulsion resin thus produced induces a kind of gelling reaction upon contacting with cationic resin or organic base, cationic emulsion or nonionic resin.

A use of emulsion reduces amount of organic solvent used in the manufacturing process of ink or burn-off base layer. Therefore, in the manufacturing site, safe and environmental friendly manufacturing free from fire regulation can be realized.

Exemplary Embodiment 14

In the fourteenth embodiment, physical gel is used as the donor and acceptor of the present invention. The physical gel in this embodiment refers to the gel formed by physical bridge such as hydrogen bonding or ionic bonding between polymer molecules, or chelate formation. Such gels can be produced by varying heat, types of solvents, ion concentration, or pH. The water solution of agar or gelatin is turned into gel by lowering the temperature, and turned into sol by raising the temperature. Such a reversible gelling reaction can be used in the present invention.

As discussed above, two types of polymer electrolytic solutions having opposite electric charges to each other are mixed, thereby producing gel called polyion complex gel. Such a gel is subjected to various factors including types of solvents, ion concentration, pH, polymer concentration and the like; however, optimization of those parameters produces a structure that can maintain more precise three dimensional shape. For instance, polycation and polyanion in an equal quantity are added to the ink and the burn-off base layer respectively, thereby producing neutral gel in the landed ink.

Polycarboxylic acid such as polyacrylic acid or strong acid polymer such as poly(styrene sulfonic acid) is bonded with alkaline-earth metal, thereby also synthesizing gel. Such bonds is not a direct bond between metallic ion and ligand, but the bond is formed via hydration-ion, therefore, gelled ink is obtainable with ease. In those reactions, optimization of molecular weight and concentration of polymer, types of solvents, salt concentration can produce a suitable set condition of the ink for respective applications.

The gels such as agar, gelatin, agarose, alginic acid, carrageenan and the like are the products of sol-gel reaction due to their helix formations. In those cases, the ink made of gelatin water solution is heated and jetted from an inkjet apparatus to a cooled sheet, then the landed ink can be set. In a case of gelatin, it is practically useful because its sol-gel transformation tends to occur around 25° C. In a case of electrolytic polysaccharide such as alginic acid, adding calcium ion helps producing gel. Thus polysaccharide or calcium can be added to either one of the ink or the burn-off base layer, or vice versa can make the ink set suitable for respective applications. In a case of calcium, it hardly affects adversely to the finished product even the calcium is baked. Agar and agarose can be also used.

In the present invention, the gelling indicates a status where fluidity of ink lowers. For instance, a combination of protogenic polymer such as polyacrylic acid, polyaryl amine, polyvinyl alcohol, with protophilic polymer such as polyethylene glycol, polyvinyl pyrrolidone can produce gel. In a case of using such polymer gel or polymer complex, the percentage composition of the protogenic polymer and protophilic polymer can be adjusted as approx. 1:1, so that stable gelling reaction is expected. Optimization of polymer concentration, ion concentration, and pH upon request can realize the ink-set condition suitable for the request.

In a case of polymer having ligand, which can form complex as side chain, such as poly(carboxylic acid), polyol and polyamine, adding polyvalent metal ion can help producing ion. For instance, polyvinyl alcohol in copper acetate aqueous solution is used as the burn-off base layer, and the ink including $NH_3$ functional group lands on this base layer. Then the landed ink becomes gel instantaneously. Reaction of hydrocolloid such as alginate, mannan with bivalent metal ion such as calcium ion also produces gel. In a case of such gel, chelator such as ethylene diamine tetra-acetate (EDTA) is added so that calcium ion is removed, whereby the gel turns into sol again. Arbitrary control of this gelling-soling reaction can optimize manufacturing methods of various electronic components suitable for respective applications and products.

Xanthan gum of polysaccharide, which is used as bodying agent or gelling agent in food, can be used in this application of the present invention. Hyaluronic acid can be also used in this application because of its high water absorbing property. Curdlan of polysaccharide is not water-soluble but can be gelled at 54° C. and, at 80° C. it is further gelled thermally irreversible, thus it can be used in this application. As discussed above, in the case of natural polymer, various gelling reactions are available. For instance, starch, agar, carageenan, and gelatin can be gelled by hydrogen bonding (gelling by cooling in particular). Adding polyvalent metal ion to alginic acid, pectin, carboxymethyl cellulose, or mannan can produce gel. Methyl cellulose or hydroxy-propyl cellulose can be gelled by its hydrophobic interaction (gelled by heating, e.g., alkyl side-chain of carbon number 6, 12, 16 is added in a quantity of several % to hydroxy-propyl cellulose, then gelling reaction occurs). Xanthan gum or hyaluronic acid can be gelled by cooling. Curdlan can be gelled by heating. Those reactions can be used in the present invention. Hyaluronic acid made by cosmetic manufacturers or food manufactures in Japan is available. They manufacture this acid by fermentation method or extract it from cock's comb.

In a case of protein, gelatin or collagen can be gelled by cooling. Egg white albumin, soybean protein or casein can be gelled by heating (or protein association). Fibrin, elastin or keratin is possibly gelled by covalent bond. Those gelling reaction can be also used in the present invention.

Various materials developed for disposal diapers, sanitary napkins, skincare, and hair-care can be also used. Polymer aggregating agent (electrolytic polymer that aggregates fine particles dispersing in water) can be used in the burn-off base layer, so that fine particles of the metal or the oxide contained in the ink landed on the base layer can be flucculated or precipitated for setting the ink. For such an application, non-ion or anion polymer, cationic polymer and amphoteric polymer are commercially available. They can be used in the present invention responsive to respective applications.

The jet-ink used in the present invention preferably contains at least one of metal powder, dielectric powder, glass powder, ceramic powder, ferrite powder, oxide powder in a quantity of 1 to 80 weight %. If the content is less than 1 weight %, a predetermined electrical properties sometimes cannot be obtained after baking. If the content is not less than 81 weight %, ink sometimes clogs the inkjet printer. A particle diameter of those powder is preferably ranges from 0.001 μm to 10 μm. If the diameter is less than 0.001 μm, pieces of powder become too small, which invites a higher cost, and sometimes a given electrical property cannot be obtained. If the diameter is not less than 12 μm, the powder percipitates or flucculates in the jet-printer, which eventually clogs. The viscosity of jet-ink is preferably not more than 2 poise. If the viscosity is not less than 2.5 poise, a jet printer is hard to jet the ink, and jets the ink in dispersed directions. In a case of jetting the ink in dispersed directions, landing accuracy of the ink on the sheet degrades, so that the inkjet cannot form a precise pattern.

Reactive material or organic material containing functional groups such as carboxylic acid, carboxyl group or amine, they are to be donors or acceptors proposed by the present invention, is preferably contained in the ink or the burn-off base layer in a quantity of not less than 0.01 weight %. If the content is less than 0.01 weight %, the ink set status required in the present invention sometimes cannot be obtained.

When the burn-off base layer is to disappear, the thickness is preferably not more than 20 μm. If the thickness is not less than 25 μm, the pattern formed on the base layer slips or deforms when the base layer disappears. In the case of reaction produced by difference in pH, the difference is preferably not less than 0.5. If the difference is less than 0.3, the landed ink sometimes cannot be gelled.

The gelling reaction proposed in the present invention is a phenomenon occurs between plural jet-inks, or jet-ink and a burn-off base layer, or jet-ink and a substrate supposed to be printed. The gel per se is preferably an organic substance to be burnt off. However, as discussed above, metal, oxide, or metal ion thereof contained in the jet ink or the burn-off base layer reacts with another organic substance after the landing, and they can be gelled.

Thus, in accordance with the present invention, an ink pattern can be formed also on the surfaces of low ink acceptability with least oozing and dripping. The low ink acceptability surfaces of metal sheet, etc. can be provided with a high-precision ink pattern using the method of present invention. Furthermore, an ink pattern can be formed on the surfaces of cylindrical substance and other three-dimensional items with least oozing and dripping.

The ink pattern provided in accordance with the present invention is a pattern in gel state produced as the result of reaction between the base layer and the jet-ink ink landed on the base layer. Therefore, the pattern in gel state can be used also as the resist pattern (including the resist pattern for etching) employed in the manufacturing of electronic components. Various types of electronic components may be made available by taking advantage of these ink patterns or resist patterns.

Now, a method of manufacturing electronic components is described in accordance with Exemplary Embodiment 15.

Exemplary Embodiment 15

A method of manufacturing a magnet roll used in printers which make use of toner is described in exemplary embodiment 15. Magnet roll is an electronic component, also called as development roll, development sleeve, toner carrier.

In the recent laser printer business, users demand the printed image of higher quality. Conventional printers use magnet rolls made of metal pipe having sand-blasted surface. The conventional magnet rolls, however, are machined at the surface with cutting and the like devices to be finished to a high dimensional accuracy, and then the surface is roughened by sand-blasting to provide a roughness for the sake of improved toner holding. Such being the conventional situation, a magnet roll of the higher mechanical precision level has been requested. This would be realized eliminating the sand-blasting process.

An exemplary method of manufacturing a magnet roll is described in accordance with the present invention, referring to FIG. 12 through FIG. 14.

Figure 12A:
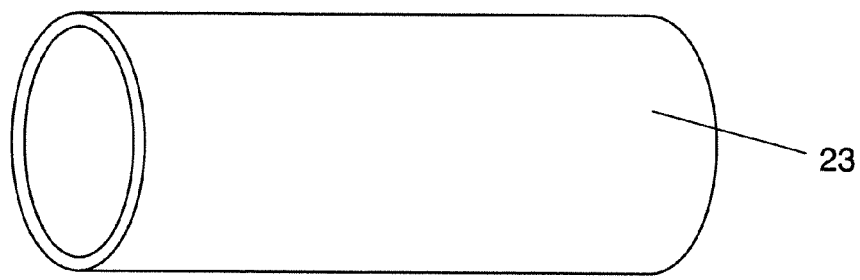
FIG. 12A shows a perspective view of a metal pipe which is a material of a magnet roll to be applied of the base layer according to an exemplary embodiment of the invention.
Figure 12B:
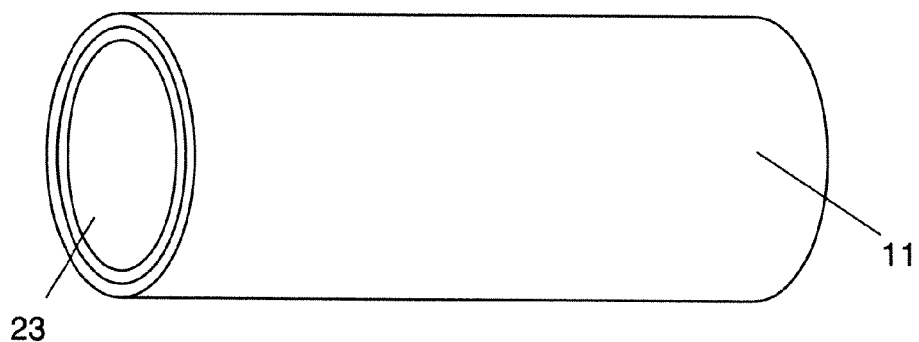
FIG. 12B is a perspective view showing the metal pipe coated at the surface with the base layer.
Figure 12C:
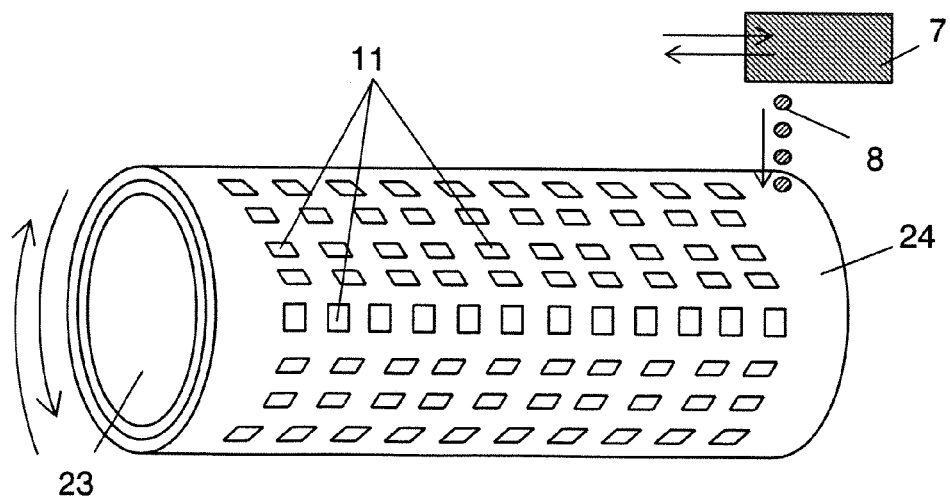
FIG. 12C is a perspective view showing how a pattern is printed by droplets jetted from an inkjet apparatus.

FIGS. 12A, 12B and 12C are perspective views used to show how a resist pattern is formed on the surface of a metal pipe. In FIG. 12A, reference numeral 23 indicates a metal pipe, of which the mechanical precision level has been raised through the cutting, grinding, etc.

FIG. 12B is a perspective view showing metal pipe 23 coated at the surface with base layer 11. Base layer 11 can be provided by means of dip coating, inkjet printing, spraying, etc.

FIG. 12C shows how a pattern is printed by droplets 8 jetted from inkjet apparatus 7. Droplets 8 form a certain resist pattern 24 after they landed on base layer 11.

As the arrow marks in FIG. 12 indicate, inkjet apparatus 7 and metal pipe 23 change their positions respectively. Resist pattern 24 is formed on the entire surface of the metal pipe by shifting inkjet apparatus 7 to and fro, while revolving metal pipe 23, in the respective directions as indicated with arrow marks. The traveling distance of inkjet 7 and the revolution angle of metal pipe 23 may be determined to an optimum according to respective applications.

Now, detailed description is made referring to FIG. 13.

Figure 13A:
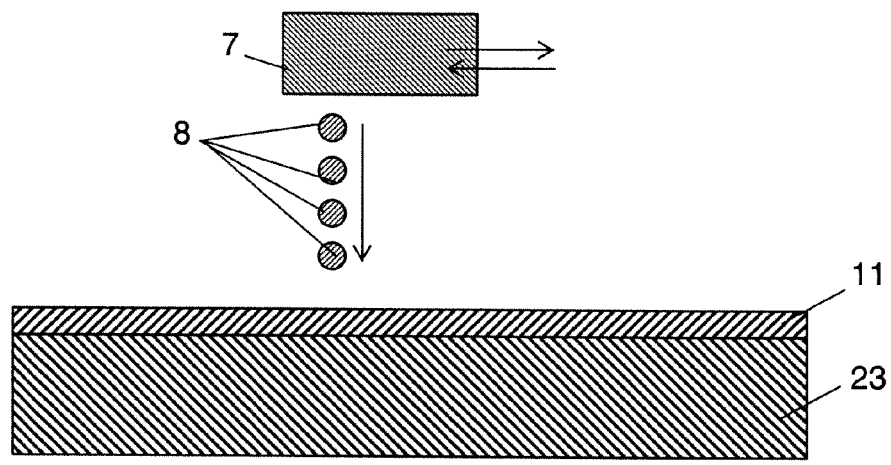
FIG. 13A is a sectional view showing how the inkjet apparatus jets the droplets for the printing.
Figure 13B:
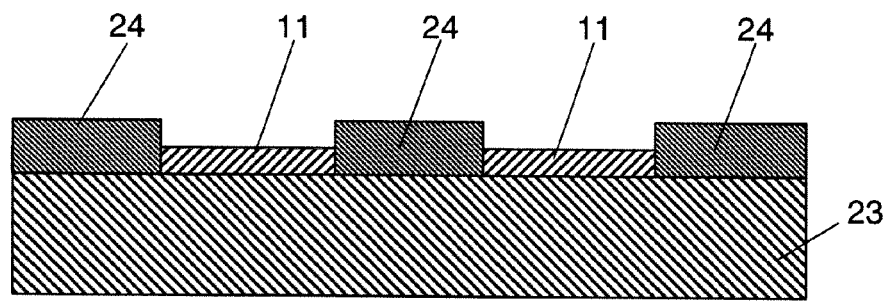
FIG. 13B is a sectional view showing that the droplet jetted from the inkjet apparatus lands on the base layer to form a resist pattern.
Figure 13C:
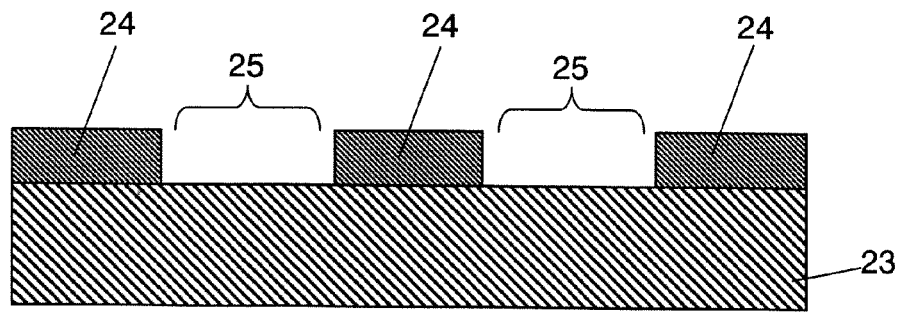
FIG. 13C is a perspective view showing the state after the base layer is removed.

FIGS. 13A, 13B and 13C are cross sectional views used to show how resist pattern 24 is formed on the surface of metal pipe 23. FIG. 13A shows how inkjet apparatus 7 jets droplets 8 for the printing.

FIG. 13B shows that droplet 8 jetted from inkjet apparatus 7 lands on base layer 11 to form resist pattern 24. FIG. 13B corresponds to a cross section of FIG. 12B.

FIG. 13C shows the state after base layer 11 is removed. In FIG. 13C, reference numeral 25 indicates opening 25, at the bottom of opening 25 the surface of metal pipe 23 is exposed uncovered. When metal pipe 23 of FIG. 13B is washed with water, for example, non-gelled part of base layer 11 is selectively washed out. Opening 25 is thus provided. Resist pattern 24 is created by gelling reaction between landed droplet 8 and base layer 11, and resist 25 pattern is not washed out and stays there.

Resist pattern 24 is a gelled compound of droplet 8 and base layer 11. Instead, resist pattern 24 may be formed with either a mixture of droplet 8 and base layer 11, or a compatible blend material of droplet 8 and base layer 11. Or, the resist pattern may be formed of a substance created by gelling reaction caused after these mixture and compatible blend material were heated. It is useful to heat resist pattern 24. Heat treatment reinforces the film strength and the withstanding property against etching solution.

Now, description is made on a case where resist pattern 24 is formed by compatible blending base layer 11 and droplet 8 landed on base layer 11 together, or mixing them, and then heating them to cause the gelling. An alkaline water-soluble resin of copolymerized isobutylene and maleic anhydride can be used for a compound which brings droplet 8 and base layer 11 into a chemical reaction or mutual reaction. The alkaline water-soluble resin can be made into water-soluble state by having it reacted with sodium hydroxide, ammonia.ammine, etc. Alkaline water-soluble resin is an organic substance that burns-off at a temperature not lower than 300° C.

First, as shown in FIG. 12B, base layer 11 of water-soluble resin is formed on the surface of metal pipe 23. Next, as shown in FIG. 12C, a water-soluble ink containing alkaline water-soluble resin is ejected onto the base layer from inkjet apparatus 7 in the form of droplet 8. In this way, resist pattern 24 made of a compatible blend substance, or a mixture, of base layer 11 and droplet 8 is formed on the surface of metal pipe 23. The resist pattern 24 becomes insoluble after it underwent a heat treatment not lower than 120° C. This is caused because; as the result of heat treatment, the alkaline water-soluble resin and alcohol group, ammine group, epoxy group contained in the water-soluble resin of base layer 11 react to cause gelling, or becomes insoluble.

Figure 14A:
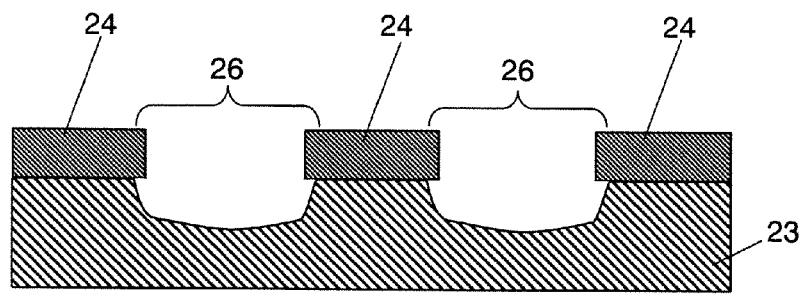
FIG. 14A is a cross sectional view showing a state after the surface of the metal pipe is etched with the resist pattern used as an etching resist.
Figure 14B:
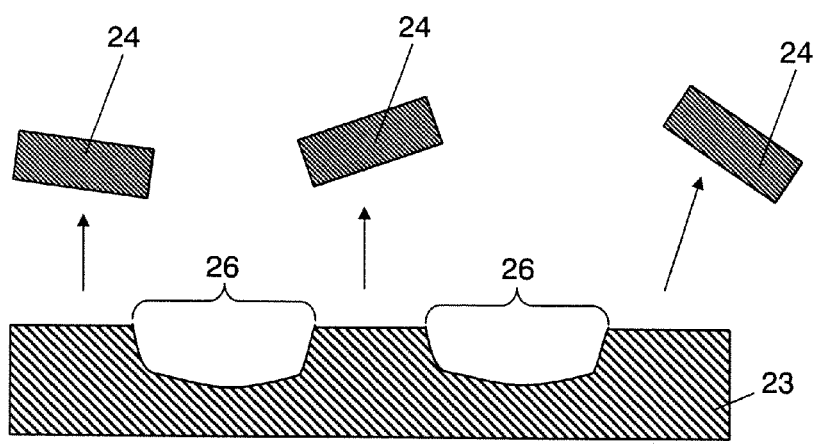
FIG. 14B is a cross sectional view showing how the resist pattern is removed.
Figure 14C:
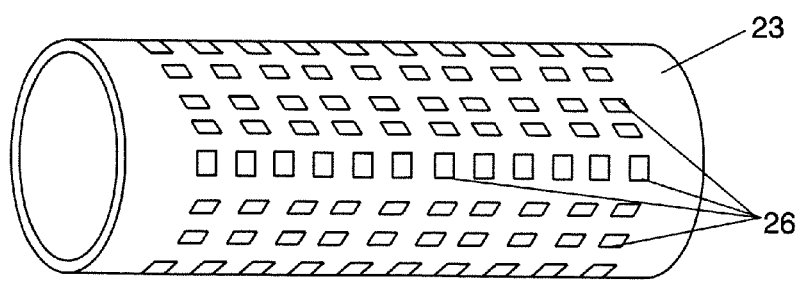
FIG. 14C is a perspective view of the metal pipe provided at the surface with recesses to form a certain specific pattern.

FIGS. 14A, 14B and 14C are cross sectional views and perspective view used to show how the surface of metal pipe 23 is etched with resist pattern 24 used as the etching resist.

FIG. 14A is a cross sectional view which shows a state after the surface of metal pipe 23 is etched with resist pattern 24 used as the etching resist. In FIG. 14A, reference numeral 26 indicates a recess created as the result of etching of surface of metal pipe 23.

FIG. 14B is a cross sectional view showing how resist pattern 24 is removed. Resist pattern 24 can be removed by immersing it in warm water of approximately 60° C. through 90° C., or by applying a high pressure jet of warm water. For the purpose of removing resist pattern 24, a rubbing operation using a resin-made brush, etc. may be useful.

FIG. 14C is a perspective view of metal pipe 23 provided at the surface with recesses to form a certain specific pattern. By inserting a certain specific magnetic member at the central part or other place in the inside of metal pipe 23, a magnet roll is completed to be incorporated in a printer.

Exemplary Embodiment 16

In the embodiment 16, description is made on the improvement in the quality of images printed with a magnet roll of embodiment 15 revolving at high speed.

In the recent laser printers, users demand higher printing speed. For this purpose, amount of toner transfer per unit time by a fast revolving magnet roll has to be raised. However, recesses 26 of conventional sand-blasted magnet rolls have smooth inner wall surface. So, toner sometimes slips on the smooth surface of the inner wall of hollow 26. When magnet roll is driven at a high revolution speed, the amount of toner transfer per unit time sometimes decreases.

Therefore, a magnet roll which does not allow the toner to make slipping on the inner wall surface of recess 26 even when it is revolving at high speed has been requested.

Figure 15A:
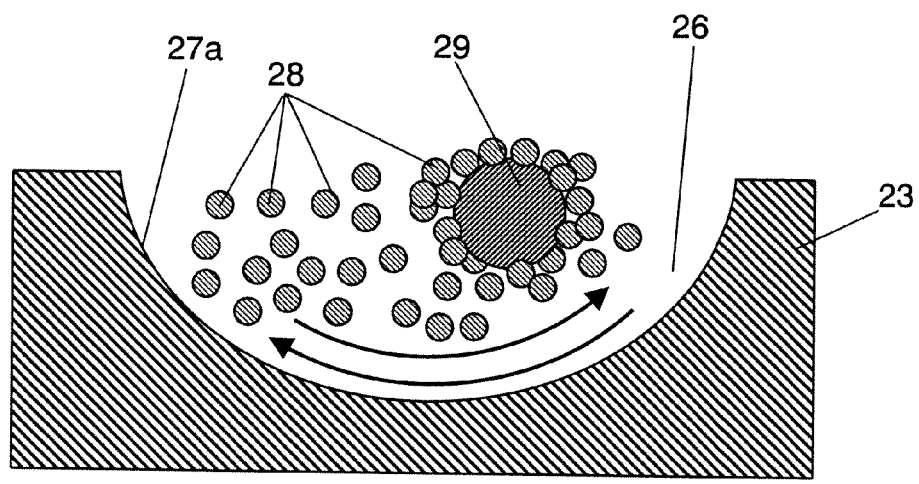
FIG. 15A is a cross sectional view of a recess used to show how toner and a carrier slip on a smooth surface.
Figure 15B:
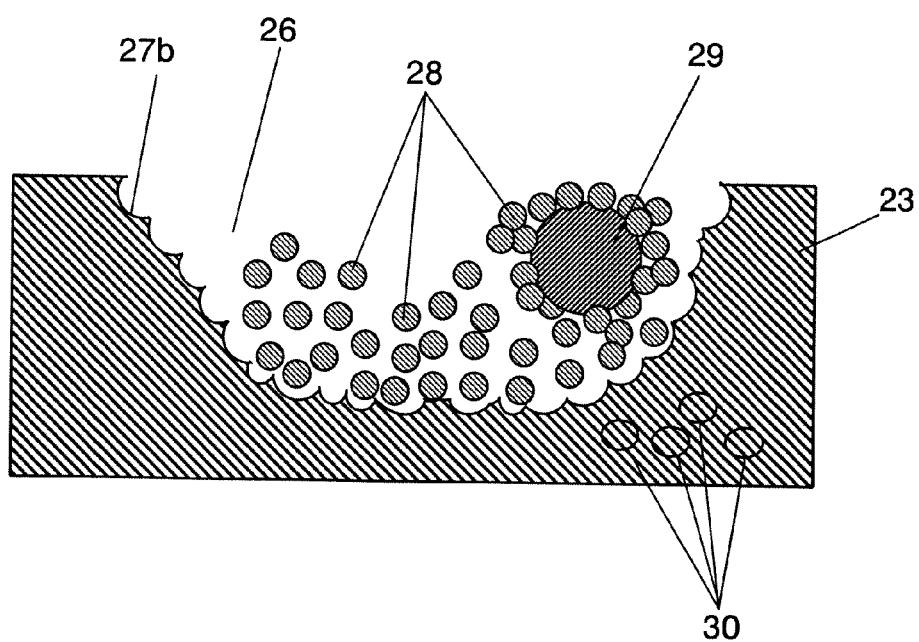
FIG. 15B is a cross sectional view used to describe how toner and a carrier are held retained without slipping on a roughened inner wall surface of a recess according to an exemplary embodiment of the invention.

FIGS. 15A and 15B illustrate how toner slips on the inner wall surface of recess 26, and how to prevent it.

FIG. 15A is a cross sectional view of recess 26 used to show how toner and the carrier slip on the smooth surface. FIG. 15B is a cross sectional view used to describe how toner and the carrier are held retained without slipping on the roughened inner wall surface of recess 26.

In FIG. 15A, reference numeral 27a indicates the inner wall surface having a smooth surface. Numeral 28 indicates toner, while numeral 29 indicates the carrier. Toner 28 is as small as several microns in the diameter. So, toner 28 and carrier 29 sometimes slip on the smooth surface of inner wall 27a along the directions of arrow marks.

FIG. 15B shows how roughened surface 27b of recess 26 prevents toner 28 and carrier 29 from making slippage. In FIG. 15B, inner wall surface 27b of recess 26 is provided with an irregularity that corresponds to grain diameter of toner 28. Toner 28 is hooked by the inner wall surface 27b's irregularity matching the grain diameter of toner 28; so, the slipping is curbed.

In order to form the irregularity matching toner 28's grain diameter on inner wall surface 27b of recess 26, it is preferred to take advantage of grain boundary 30 of an alloy metal (e.g. aluminum alloy) constituting metal pipe 23. By choosing an aluminum alloy material whose grain boundary 30 corresponds to the size of toner 28's grain diameter, an irregularity that corresponds to the grain size of toner 28 can be formed evenly covering substantially the entire area of inner wall surface 27b.

Preferred average grain diameter for toner 28 is several microns (more preferably, not smaller than 1 micron and not larger than 20 microns; further preferably, not smaller than 2 microns and not larger than 10 microns). Further preference in this case is that the average grain diameter of grain boundary 30 falls within a range not lower than 10% and not higher than 500% of average grain diameter of toner 28. If it goes outside the above-described range, the anti-slipping effects might deteriorate.

Thus, the slipping of toner 28 can be avoided by taking inter-relationship between the average grain size of grain boundary 30 and the average grain size of toner 28 into consideration. Irregularity where a protrusion relevant to grain boundary 30 is effectively pushing up on inner wall surface 27b can be provided by electrolytic etching process. The electrolytic etching can form an irregularity making use of the differences in the electro-conductivity and the etching speed arising from grain boundary 30.

The irregularity on inner wall surface 27b should ideally be consisting of recesses formed after grain boundary 30 fell off as the result of etching, or protrusions formed of grain boundary 30, or a combination of the above recesses and protrusions.

The size of carrier 29 may be greater than that of grain boundary 30. This is because; toners 28 sticking on the surface of carrier 29 are hooked by protrusion of grain boundary 30 protruding on the inner wall surface 27b.

As to an etching solution for the electrolytic etching, it is economical to use a water solution of hydrochloric acid (not lower than 1 wt % and not higher than 10 wt %). If the concentration of hydrochloric acid is lower than 1 wt %, it takes too much time for etching metal pipe 23, if it is higher than 10 wt % it will need a special care for handling. As to a material for metal pipe 23, AL (aluminum) is preferred to SUS (stainless steel). In some cases, SUS pipe would face difficulties in forming recess 26 by etching, or in providing a protrusion of grain boundary 30 protruding on inner wall surface 27.

It is preferred that metal material of metal pipe 23 is an aluminum alloy which contains at least silicon for not less than 0.20% and not more than 0.60%, or magnesium for not less than 0.45% and not more than 0.90%. Or, an aluminum alloy which contains at least silicon for not less than 0.20% and not more than 0.60%, in addition, magnesium for not less than 0.45% and not more than 0.90%, may be used. The latter aluminum alloy facilitates the ease of realizing a higher precision level after machining it with cutting or grinding tools. Also, controlling the size of grain boundary 30 to be within a range of 5 through 30 microns will become easier with the latter alloy. The element used for the control of grain boundary 30 is not limited to magnesium and silicon. Instead, it may be controlled by adding iron, chromium, titanium or the like metal components.

Thus, silicon, magnesium, iron, chromium, titanium and the like metal component other than aluminum is separated out to grain boundary 30. By making part of these metal components other than aluminum to separate out actively on inner wall surface 27b, the function of retaining toner 28 from slipping will be ensured.

Exemplary Embodiment 17

A method of manufacturing gravure cylinder, which being one of the electronic components, is described in accordance with Embodiment 17. The gravure cylinder is one of electronic components used in gravure printing process widely practiced for production of many types of electronic components. Gravure cylinder, or an electronic component, is used not only for printing on paper but it is used in many other sectors, for example, flat panel display (e.g. EL display) which is made through the roll to roll process, gravure printing on a green sheet or film.

Conventional gravure cylinder is made of a metal column of approximately 50 mm through 300 mm diameter, for example, which is plated electrically on the surface with copper for approximately 100 microns thick. The cylinder surface is polished and then coated with a photo resist, and then exposed and developed. Finally, the copper at the surface is etched to a certain specific pattern, and then hard chromium plating is applied for the purpose of protecting the surface of a finished gravure cylinder.

The conventional method of manufacturing gravure cylinders necessitated photo resist or the like expensive materials and expensive facilities for the exposure.

In a manufacturing method of the present invention, however, such expensive items as photo resist and exposure facility are unnecessary, as described above in the Embodiment 15, etc. Thus, cost of the gravure cylinders can be reduced a step further.

In the case where a resist pattern is formed in accordance with the present invention, central portion of the metal column can be removed after the electroplated copper is etched to a certain specific pattern. In this way, a thin metal tube of approximately 1 mm through 10 mm in diameter having a pattern formed on the surface is provided. The metal tube may be used for production of electronic components. Or, the metal tube may be incorporated into an electronic component.

Furthermore, a multi-layered circuit board formed of glass epoxy resin containing three-dimensional wiring, and other types electronic components can be manufactured by making use of a resist pattern 24 in accordance with the present invention.

What is claimed is:

1. An ink for an ink jet apparatus, the ink including a component of at least 0.01 weight %, which reacts with an additive component of organic substance included in a base layer formed on a surface of a printing object to cause gelling, wherein the component is burnt off by baking at a temperature not lower than 300° C.

2. The ink for ink jet apparatus of claim 1 having a thickness of not more than 20 μm and comprising material which includes one of metal powder and oxide powder, of which particle diameter ranges from not less than 0.001 μm to not more than 10 μm, in a quantity of not less than 1 weight % and not more than 80 weight %.

3. The ink for ink jet apparatus of claim 1 which forms resist pattern reacting with the additive organic substance contained in the base layer.

* * * * *